(12) United States Patent
Yoshino

(10) Patent No.: US 6,914,293 B2
(45) Date of Patent: Jul. 5, 2005

(54) NONVOLATILE SEMICONDUCTOR MEMORY DEVICE AND METHOD FOR MANUFACTURING SAME

(75) Inventor: Akira Yoshino, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/716,703

(22) Filed: Nov. 20, 2003

(65) Prior Publication Data

US 2004/0108540 A1 Jun. 10, 2004

(30) Foreign Application Priority Data

Dec. 9, 2002 (JP) ........................................ 2002-357171

(51) Int. Cl.[7] ............................................ H01L 29/792
(52) U.S. Cl. ........................ 257/324; 257/315; 257/411
(58) Field of Search ................................. 257/324, 315, 257/411

(56) References Cited

U.S. PATENT DOCUMENTS

| | | | |
|---|---|---|---|
| 5,768,192 A | 6/1998 | Eitan ..................... | 365/185.24 |
| 5,966,603 A | 10/1999 | Eitan .......................... | 438/258 |
| 6,524,913 B1 * | 2/2003 | Lin et al. ..................... | 438/261 |
| 6,645,801 B1 * | 11/2003 | Ramsbey et al. ............ | 438/216 |
| 6,784,483 B2 * | 8/2004 | Chen ............................ | 257/317 |

FOREIGN PATENT DOCUMENTS

| | | |
|---|---|---|
| JP | 63-186477 | 8/1988 |
| JP | 6-21444 | 1/1994 |
| JP | 2000-49113 | 2/2000 |
| JP | 2002-280464 | 9/2002 |
| JP | 2004-39866 | 2/2004 |
| JP | 2004-111737 | 4/2004 |

* cited by examiner

*Primary Examiner*—David Nelms
*Assistant Examiner*—Tu-Tu Ho
(74) *Attorney, Agent, or Firm*—Young & Thompson

(57) ABSTRACT

Nonvolatile semiconductor memory devices and methods for manufacturing thereof, which provide inhibiting the shortcutting of the channel due to the creation of the bird's beak to promote the manufacturing of the devices with higher-density or higher-integration, lowering the operation voltage and improving the characteristics of maintaining the electric charge, without complicating the manufacturing process. Immediately after forming an ONO films comprising a first silicon oxide film, a second silicon nitride film and a third silicon oxide film on a silicon substrate, a silicon layer is formed, and then, arsenic ions are implanted over the silicon layer and/or ONO films to form a bit line, and a second electrical conductive layer is deposited while remaining the silicon layer to form a word line comprising a dual layer structure of two electrical conductive layers.

9 Claims, 12 Drawing Sheets

ARSENIC ION IMPLANTATION

NONVOLATILE SEMICONDUCTOR MEMORY DEVICE AND METHOD FOR MANUFACTURING SAME

This application is based on Japanese patent application NO. 2002-357171, the content of which is incorporated hereinto by reference.

BACKGROUND OF THE INVENTION

1. Field of the Invention

The present invention relates to a nonvolatile semiconductor memory device and a method for manufacturing same. More specifically, the present invention relates to a MNOS (metal nitride oxide semiconductor) or a MONOS (metal oxide nitride oxide semiconductor) nonvolatile semiconductor memory device, which is capable of storing information by utilizing electric charge that is trapped by an insulating film of a multi-layer structure thereof, and a method for manufacturing same.

2. Description of the Related Art

Floating gate (FG) transistors are generally employed for memory devices of the nonvolatile semiconductor memory device, which is also referred to flash memory. The FG transistor is a type of a device having a dual-layer gate electrode structure, in which information electric charge is stored within a first gate electrode that functions as a floating gate electrode. In this structure, the first gate electrode is formed on a silicon oxide film disposed on a principal surface of a semiconductor substrate in a floating manner, and an interlayer insulating film comprising a combined structure of a silicon oxide film and a silicon nitride film is disposed on the upper surface of the first gate electrode, and further a second gate electrode, which also functions as a control electrode, is formed on the upper surface of the interlayer insulating film.

However, the principle of the retention of the information electric charge in the FG transistor provides poor characteristics of the retention of the information electric charge, so that a relatively thicker silicon oxide film having a thickness of 9 nm or more is required for a tunnel oxide film disposed between the principal surface of the semiconductor substrate and the floating gate electrode. This configuration adversely limit an effort for reducing of the electric voltage required for writing and erasing the information electric charge.

Thus, MNOS transistors or MONOS transistors comprising a multi-layer film of a silicon oxide film and a silicon nitride film have been employed in recent years. Since the MNOS transistor is capable of accumulating information electric charge within the gate insulating films of the dual layer-structure at an interface state created in an interface region between each of the dual insulating films or at an electric charge trapping state created within the insulating film, the reduction of the thickness of the tunnel oxide film between the principal surface of the semiconductor substrate and the floating gate electrode can be easily achieved, and therefore the thinner tunnel oxide film having a thickness of 3 nm or less can be employed. Therefore, MNOS transistor possibly provides, in principle, to reduce the operating electric voltage, and in particular, the voltage for writing and erasing the information electric charge.

In operating the MNOS transistor, the writing of the information electric charge is conducted by directly injecting electron from the semiconductor substrate to the above-mentioned interface region through a tunnel of a silicon oxide film having a thickness of about 2 nm that is formed on the principal surface of the semiconductor substrate, and conversely, the erasing of the information electric charge is conducted by releasing the electric charge from the interface region to the semiconductor substrate. The writing state of the information electric charge corresponds to a logic "1" for stored information, and the erasing state of the information electric charge corresponds to a logic "0" for stored information. Thus, various studies have intensively been carried out for practically utilizing the M(O)NOS transistors, which are principally capable of writing and erasing thereof at lower voltage, for the application of the memory devices of the nonvolatile semiconductor memory devices such as flash memory.

The exemplary application of the MONOS transistors for the nonvolatile semiconductor memory device of the flash memory is a memory device, a fundamental structure of which is disclosed in U.S. Pat. No. 5,768,192. Further, more recently, a technology useful for considerably simplifying the manufacturing process for forming the nonvolatile memory is disclosed in U.S. Pat. No. 5,966,603 as a disclosure of NROM (nitride read only memory). In this disclosure, the fundamental structure of the nonvolatile memory device is similar to that disclosed in U.S. Pat. No. 5,768,192.

A conventional method for manufacturing NROM will be described below with reference to FIGS. 9A to 9E. FIGS. 9A to 9E are the cross sectional views of the NROM cut along the word line, showing the processing steps thereof.

As shown in FIG. 9A, a surface of a silicon substrate 1 is thermally oxidized to form a silicon oxide film, and then a silicon nitride film is deposited thereon via chemical vapor deposition (CVD), and thereafter the surface of the deposited silicon nitride film is oxidized via an ordinary thermal oxidization or radial oxidization to transform the surface of the silicon nitride into a silicon oxide film. Thus, an ONO films 3 comprising a triple-layer structure of the silicon oxide film/silicon nitride film/silicon oxide film is formed.

Then, as shown in FIG. 9B, a patterned resist layer 6 having a stripe shaped (slit shaped) diffusion layer-pattern is formed on the ONO films 3 via a known lithography technology. Then, the exposed portion of the ONO films 3 is etched via the etching mask of the patterned resist layer 6 by a known etching technology.

Then, as shown in FIG. 9C, n-type impurity such as arsenic is implanted through the ion implantation mask of the patterned resist layer 6 as, and thereafter the patterned resist layer 6 is removed.

Then, as shown in FIG. 9D, entire surface thereof is thermally oxidized. An insulating film having a thickness of about 110 nm is formed on a diffusion layer 2 via the thermal oxidization process to form a bit-line oxide 13.

Then, as shown in FIG. 9E, a polysilicon film having a thickness of about 50 nm and a tungsten silicide film having a thickness of about 150 nm are successively deposited to form an electrical conducting layer 14, and thereafter the electrical conducting layer is processed via a known lithography method and a known dry etching method to form a word line.

A bit line of the NROM cell, which is formed of the diffusion layer 2, is formed on the silicon substrate 1 via the above-mentioned manufacturing method, and the ONO films 3 provides a region for writing and erasing the information electric charge. Further, the word line is formed perpendicularly to the bit line to complete a fundamental structure of the NROM cell.

Next, the basic operation of the MONOS transistor, which forms the fundamental structure of the above-mentioned NROM cell, will be described below. In the operation of writing the information electric charge (electron in this example), as shown in FIG. 10A for example, the silicon substrate 1 and the first diffusion layer 2a are set at the ground potential, the voltage $V_W$ of the second diffusion layer 2b is set at 3 V, and the voltage $V_{GW}$ of the gate electrode 15 is set at about 5 V. When these voltages are applied thereto, a flow of electron (channel electric current) is created from the first diffusion layer 2a, which functions as the source, to the second diffusion layer 2b, which functions as the drain, and the channel electric currents become channel hot electrons (CHE) in vicinity of the second diffusion layer 2b, and some of the generated channel hot electrons flow beyond the barrier of the silicon oxide film (first insulating film 3a) that underlies the ONO films 3, and are trapped by the trapping region 17 of the silicon nitride film (second insulating film 3b). Thus, when the writing operation of electrons is conducted, the information electric charge is stored in the region of the silicon nitride film near the edge of the second diffusion layer 2b.

Then, in the operation of reading the information, the second diffusion layer 2b, on the other hand, is set to the ground potential to function as the source as shown in FIG. 10B, and a voltage $V_R$ of the first diffusion layer 2a, which functions as the drain, is set to 1.5 V, and a voltage $V_{GR}$ of the gate electrode 15 is set to about 3 V. Here, the silicon substrate 1 is maintained to the ground potential. Having this configuration, when the logic state is "1" indicating that electrons are written into the trapping region 17, no current flows between the first diffusion layer 2a and the second diffusion layer 2b. On the contrary, when the logic state is "0" indicating that no electron is written into the trapping region 17, electric current flows between the first diffusion layer 2a and the second diffusion layer 2b. As such, the written information is read.

Then, in the operation of erasing the information, the configuration shown in FIG. 10A, for example, includes that the silicon substrate 1 and the first diffusion layer 2a are set to the ground potential, and a voltage $V_E$ of the second diffusion layer 2b is set at 5 V, and the voltage $V_{GE}$ of the gate electrode 15 is set at about −5 V. When these voltages are applied thereto, holes, which are created by the band-to-band tunneling (BTBT) due to the band-bending generated in a region of the edge of the second diffusion layer 2b where the edge overlaps the gate electrode, are introduced into the above-mentioned trapping region 17, thereby erasing the written information.

In this erasing operation, the holes created by the BTBT are pushed out toward the channel region, and accelerated when the holes proceed through a depletion layer of pn junction created between the p-type channel region and the n-type diffusion layer 2 to become the higher-energy state. The level of the acceleration of the holes depends on the state of the depletion layer of the pn junction, i.e., voltage between the drain and the substrate. If there is no factor for drawing the created holes toward the side of the gate electrode 15 (e.g., negative charge, or negative gate voltage), the holes proceed outside to create the substrate electric current.

In the case of the MONOS cell, when the MONOS cell is in the state in which the writing operation is completed, clusters of electrons appear in the silicon nitride film (second insulating film 3b) in vicinity of the drain, and the above-mentioned holes form electric flux lines toward the cluster of electrons and are exerted with a force along thereof. Thus, the holes acquire the higher energy state so that the energized holes are capable of exceeding the energy barrier of Si/SiO$_2$, and the energized holes are injected into the inside of the silicon nitride film where the injected holes are recombined with electrons. When the recombination phenomenon proceeds, the number of electrons trapped in the silicon nitride film decreases and the number of the electric flux lines from the holes to the electrons decreases, and thus the driving force for injecting the holes into the ONO films 3 also decreases. Consequently, the MONOS cells utilizing the above-mentioned writing and erasing scheme does not have theoretical bases for causing the over-erasing problem, which often becomes problem for the operation of ordinary FG cell.

Nevertheless, the above-mentioned conventional MNOS or MONOS nonvolatile semiconductor memory device may cause another problem, in which an inroad portion called as "bird's beak", which is formed by the growth of the oxide film in the lateral direction, is created during the above-mentioned formation of the bit-line oxide 13 via thermal oxidation. The growth of the bird's beak reduces the distance between each of the diffusion layers (for example, between the first diffusion layer 2a and the second diffusion layer 2b), thereby easily causing the shortcutting of the channel therebetween. This limits the miniaturization of the NROM cell, constraining the manufacturing of the NROM having higher-density or higher-integration.

Further, in the conventional method, a bending of the ONO films 3 near the edge of the bit-line oxide 13 due to the creation of the bird's beak alters the band structure of the silicon nitride film, deteriorating the characteristics of maintaining the information electric charge. In addition, since various processing steps such as the formation of the patterned resist layer, the stripping thereof and the thermal oxidation thereof are carried out after the formation of the ONO films 3 and before the formation of the electrical conductive layer 14 thereon for the word line, it is difficult to maintain better interface characteristics between the word line and the ONO films 3, thereby deteriorating the reliability of the formed devices.

SUMMARY OF THE INVENTION

In view of the above situation, the present invention provides a solution to the above-mentioned problems, and it is a main object of the present invention to provide MNOS or MONOS nonvolatile semiconductor memory devices and methods for manufacturing thereof, which provide inhibiting the shortcutting of the channel due to the creation of the bird's beak to achieve the miniaturization of the device with higher-density, lowering the operation voltage and improving the characteristics of maintaining the electric charge, without complicating the manufacturing process.

According to the present invention, there is provided a nonvolatile semiconductor memory device, comprising: a semiconductor substrate having thereon a plurality of diffusion layers for forming bit lines and a plurality of channel regions disposed between the adjacent diffusion layers; an insulating film formed on the semiconductor substrate for trapping electric charge; an electrical conductive film formed on the insulating film for forming a word line, wherein the insulating film is generally flatly formed on both the diffusion layer and the channel region.

The insulating film may have a multi-layer structure comprising a silicon oxide film and a silicon nitride film, or a structure in which silicon fine particles (silicon-nano-dot) are dispersed in at least a portion of a silicon oxide film. The information-storing operation of the nonvolatile semiconductor memory device according to the present invention may be conducted by utilizing electric charge trapped by the insulating film.

The electrical conductive film may comprise at least a first electrical conductive film formed on the insulating film on the channel region and a second electrical conductive film covering the first electrical conductive film.

The nonvolatile semiconductor memory device may further comprise an oxide film formed on the insulating film on the diffusion layers. The oxide film may be formed by oxidizing the first electrical conductive film.

According to the present invention, there is provided a nonvolatile semiconductor memory device, comprising: a semiconductor substrate having thereon a plurality of diffusion layers for forming bit lines and a plurality of channel regions disposed between the adjacent diffusion layers; an insulating film formed on the semiconductor substrate for trapping electric charge; an electrical conductive film formed on the insulating film for forming a word line, wherein the insulating film is generally flatly formed on the channel region, and wherein the electrical conductive film comprises at least a first electrical conductive film formed on the insulating film on the channel region and a second electrical conductive film covering the first electrical conductive film.

The nonvolatile semiconductor memory device may further comprise an oxide film on the diffusion layer. The oxide film may be formed by oxidizing the first electrical conductive film and the insulating film.

The insulating film may be formed such that the thickness of the insulating film is smaller on the diffusion layers than the thickness thereof on the channel regions.

The first electrical conductive film may include polycrystalline silicon, amorphous silicon, or a silicon compound, and wherein the second electrical conductive film may include polysilicon or refractory metal silicide.

The insulating film may comprise ON films which is formed by depositing a silicon oxide film and subsequently depositing a silicon nitride film thereon, or ONO films which is formed by depositing a silicon oxide film, subsequently depositing a silicon nitride film thereon and subsequently depositing a silicon oxide film thereon.

According to the present invention, there is provided a method for manufacturing a nonvolatile semiconductor memory device, comprising: forming an insulating film on a semiconductor substrate; forming a first electrical conductive film on the insulating film; and implanting an impurity into the semiconductor substrate through at least the insulating film to form a diffusion layer on the semiconductor substrate. The method may further include forming a second electrical conductive film on the first electrical conductive film.

The impurity may be implanted through the first electrical conductive film and the insulating film in the implanting the impurity.

The method may further comprise selectively removing the first electrical conductive film before the implanting the impurity, wherein the impurity is implanted through the insulating film into the region of the semiconductor substrate where the first electrical conductive film thereon is removed in the implanting the impurity.

The first electrical conductive film on the diffusion layer, or the insulating film and the first electrical conductive film may be transformed by thermal oxidation or radical oxidization to an oxide film.

According to the present invention, there is provided a method for manufacturing a nonvolatile semiconductor memory device, comprising: forming an insulating film on a silicon substrate; forming a first electrical conductive film on the insulating film; forming a patterned mask on the first electrical conductive film; implanting via the patterned mask an impurity thereto through the first electrical conductive film and the insulating film to form a diffusion layer on a surface of the silicon substrate for forming a bit line; removing the patterned mask; forming a second electrical conductive film on the first electrical conductive film; and forming a word line comprising a dual-layer structure of the first electrical conductive film and the second electrical conductive film.

The insulating film may be ONO films comprising a silicon oxide film, a silicon nitride film and a silicon oxide film.

The patterned mask may include a resist, a silicon oxide film or a silicon nitride film.

According to the present invention, there is provided a method for manufacturing a nonvolatile semiconductor memory device, comprising: forming an insulating film; forming a first electrical conductive film on the insulating film; forming a patterned mask on the first electrical conductive film; removing an exposed portion of the first electrical conductive film via the patterned mask; implanting via the patterned mask an impurity thereto through the insulating film to form a diffusion layer on a surface of the silicon substrate for forming a bit line; removing the patterned mask; forming a second electrical conductive film on the first electrical conductive film; and forming a word line comprising a dual-layer structure of the first electrical conductive film and the second electrical conductive film.

According to the present invention, there is provided a method for manufacturing a nonvolatile semiconductor memory device, comprising: forming an insulating film; forming a first electrical conductive film on the insulating film; forming a patterned mask on the first electrical conductive film; implanting via the patterned mask an impurity thereto through the first electrical conductive film and the insulating film to form a diffusion layer on a surface of the silicon substrate for forming a bit line; oxidizing the exposed portion of the first electrical conductive film by thermal oxidization or radical oxidization to form an oxide film on the insulating film; after removing the patterned mask, forming a second electrical conductive film on the first electrical conductive film; and forming a word line comprising a dual-layer structure of the first electrical conductive film and the second electrical conductive film. Here, the patterned mask may be a silicon nitride film.

According to the present invention, there is provided a method for manufacturing a nonvolatile semiconductor memory device, comprising: forming an insulating film; forming a first electrical conductive film on the insulating film; forming a patterned mask on the first electrical conductive film; implanting via the patterned mask an impurity thereto through the first electrical conductive film and the insulating film to form a diffusion layer on a surface of the silicon substrate for forming a bit line; oxidizing the exposed portion of the first electrical conductive film and the insulating film underlying thereof by thermal oxidization or radical oxidization to form an oxide film on the diffusion layer; removing the patterned mask; forming a second electrical conductive film on the first electrical conductive film; and forming a word line comprising a dual-layer structure of the first electrical conductive film and the second electrical conductive film.

According to the present invention, there is provided a method for manufacturing a nonvolatile semiconductor memory device, comprising: forming an insulating film; forming a first electrical conductive film on the insulating film; forming a patterned mask on the first electrical conductive film; forming a sidewall film having a predetermined thickness on a sidewall of the patterned mask by depositing a silicon nitride film and etching back thereof; implanting via the patterned mask an impurity thereto through the first electrical conductive film and the insulating film to form a diffusion layer on a surface of the silicon substrate for forming a bit line, an opening width of the patterned mask being limited by the sidewall; removing the patterned mask and the sidewall film; forming a second electrical conductive film on the first electrical conductive film; and forming a word line comprising a dual-layer structure of the first electrical conductive film and the second electrical conductive film.

According to the present invention, there is provided a method for manufacturing a nonvolatile semiconductor memory device, comprising: forming an insulating film; forming a first electrical conductive film on the insulating film; forming a patterned mask on the first electrical conductive film; removing the exposed first electrical conductive film via the patterned mask to expose the insulating film; implanting via the patterned mask an impurity through the insulating film thereto to form a diffusion layer on a surface of the silicon substrate for forming a bit line; removing the exposed insulating film via the patterned mask; forming an oxide film on at least the diffusion layer and sidewalls of the insulating film and the first electrical conductive film, the oxide film having a thickness that is less than the thickness of the insulating film; removing the patterned mask; forming a second electrical conductive film on the first electrical conductive film; and forming a word line comprising a dual-layer structure of the first electrical conductive film and the second electrical conductive film.

According to the present invention, there is provided a method for manufacturing a nonvolatile semiconductor memory device, comprising: forming an insulating film; forming a first electrical conductive film on the insulating film; forming a patterned mask on the first electrical conductive film; removing the exposed first electrical conductive film and the insulating film underlying thereof via the patterned mask; forming an oxide film on at least the diffusion layer and on sidewalls of the insulating film and the first electrical conductive film, the oxide film having a thickness that is less than the thickness of the insulating film; implanting via the patterned mask an impurity thereto through the oxide film to form a diffusion layer on a surface of the silicon substrate for forming a bit line; removing the patterned mask; forming a second electrical conductive film on the first electrical conductive film; and forming a word line comprising a dual-layer structure of the first electrical conductive film and the second electrical conductive film.

As described above, the present invention employs a process of depositing the first electrical conductive layer (polysilicon, amorphous silicon or the like) immediately after forming the insulating films having the multi-layer structure such as the ONO films, and then implanting ions over the ONO films and the first electrical conductive layer (or over the ONO films) to form the diffusion layer. This eliminates the needs for conducting the formation of the bit-line oxide via the thermal oxidation, and consequently the generation of the bird's beak, which has been a problem in the prior art, is inhibited, and thus the deterioration of the characteristics of maintaining the electric charge due to the shortcutting of the channel and the bending of the ONO films is avoided. In addition, the present invention also employs a process of maintaining at least the ONO films and the first electrical conductive layer above the channel region. This provides a stabilized interface between the ONO films and the first electrical conductive layer that will be a part of the word line, thereby improving the reliability of the nonvolatile semiconductor memory device.

DETAILED DESCRIPTION OF THE INVENTION

As mentioned in the description of the related prior art, conventional MNOS or MONOS nonvolatile semiconductor memory devices have a problem, in which the growth of the oxide film in the lateral direction may create the bird's beak during the formation of the insulating film on the diffusion layer via thermal oxidization, and the creation of the bird's beak may promote to cause the shortcutting of the channel, and may also adversely constrain the manufacturing of the NROM having higher-density or higher-integration.

In order to address the problems, the inventors of the present invention have presented a technology which includes forming a silicon film on an ONO films comprising a third insulating film/a second insulating film/a third insulating film, and further forming a silicon nitride film thereon so that the stress of the silicon layer and the silicon nitride layer inhibits the growth of the bit-line oxide in the lateral direction, which is described in the related earlier application (Japanese patent application No. 2002-89, 139). The structures and the methods described in the related earlier application will be described below in reference to FIGS. 11A to 11D.

Figure 11A:
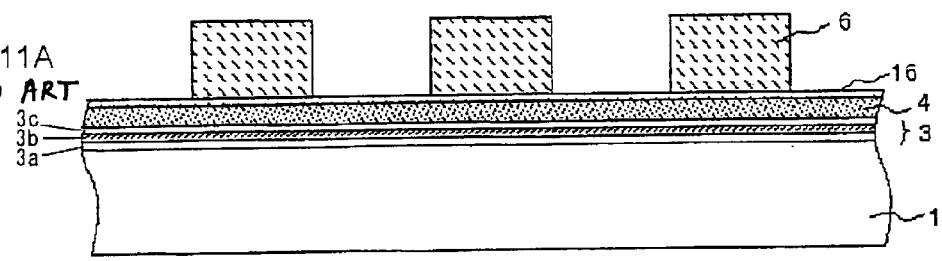
FIGS. 11A to 11D are cross sectional views of a MONOS nonvolatile semiconductor memory device, showing the manufacturing process steps for the nonvolatile semiconductor memory device according to the earlier application.

First, as shown in FIG. 11A, a first insulating film 3a of a silicon oxide film having a thickness of about 4 nm is formed by oxidizing a silicon substrate 1 via radical oxidization or thermal oxidization; and a silicon nitride film having a thickness of about 7 nm is deposited via CVD; and a surface of the deposited silicon nitride film is oxidized via thermal or radical oxidization to form a silicon oxide film having a thickness of about 4 nm. Thus, a second insulating film 3b and a third insulating film 3c are formed to form an ONO films 3 having a triple-layer structure.

Further, a silicon layer 4 having a thickness of about 30 nm, which comprises an amorphous or a polycrystalline silicon film containing a higher concentration of n-type impurity therein, is deposited via CVD, such that the deposited silicon layer 4 covers the above-mentioned third insulating film 3c. Then, a silicon nitride film 16 for an antioxidization film having a thickness of about 50 nm is deposited on the surface of the silicon layer 4 via CVD. Thereafter, a patterned resist 6 having a slit-shaped diffusion layer-pattern is formed on the silicon nitride film 16 via a known lithography technique.

Figure 11B:
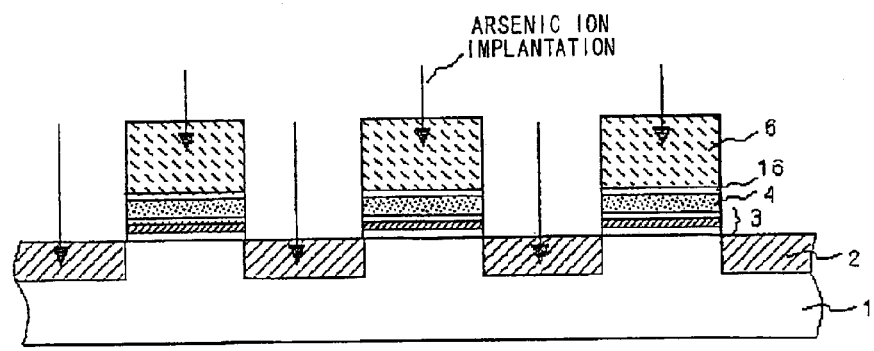

Next, as shown in FIG. 11B, the silicon nitride film 16, silicon layer 4, the third insulating film 3c and the second insulating film 3b are subsequently etched off via a known dry etching technique to form an opening. Thereafter, an n-type impurity such as arsenic is ion-implanted therein through the ion implantation mask of the patterned resist 6, and then the patterned resist 6 is removed. Then, a thermal processing is conducted thereto to form on the surface of the silicon substrate 1 a diffusion layer 2 that will be a bit line.

Figure 11C:
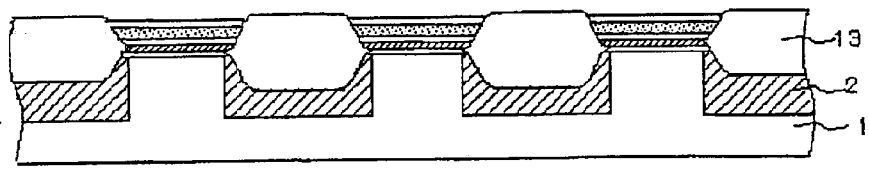

Next, as shown in FIG. 11C, the entire surface thereof is thermally oxidized similarly as in the conventional method. A bit-line oxide 13 having a thickness of about 100 nm is formed on the surface of the diffusion layer 2 by the thermal oxidization. After that, the slit-shaped silicon nitride film 16 is etched off.

Figure 11D:
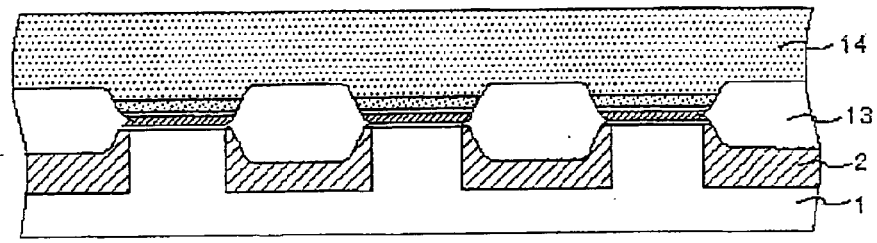

Next, as shown in FIG. 11D, a polysilicon film having a thickness of about 50 nm and containing higher concentration of n-type impurity and a tungsten silicide film having a thickness of about 150 nm are deposited on the entire surface thereof and the deposited films are processed by a known lithography technique and dry etching technique to form an electrical conductive film 14, which is a word line. In the processing for forming the word line, a slit-shaped silicon layer 4 is also processed to form a gate electrode.

As such, the bit line of the NROM cell is formed by forming the diffusion layer 2 on the silicon substrate 1, and the region for writing and erasing information electric charge is formed by forming the ONO structure of the first insulating film 3a, the second insulating film 3b and the third insulating film 3c, and further the word line 14 is formed by forming the electrical conductive film that is perpendicular to the bit line, to complete the basic structure of the NROM cell.

In this structure, the silicon nitride film 16 presents a large compressive stress to the silicon layer 4 during the thermal oxidation process for forming the bit-line oxide 13, so that the diffusion of oxygen that functions as an oxidizing agent along the lateral direction can be inhibited, and thus the generation of the bird's beak can be inhibited. In addition, the above-mentioned compressive stress may be utilized to prevent the bending of the ONO films 3 so that the deterioration of the characteristics of maintaining the information electric charge due to the altering of the band structure of the silicon nitride film i.e., the second insulating film 3b, can be inhibited. However, the above-mentioned manufacturing method described in the earlier application requires at least an additional process steps for forming the silicon layer 4 and the silicon nitride film 16 and patterning thereof, in comparison with the conventional method schematically shown in FIGS. 9A to 9E, leading the entire manufacturing process being more complicated.

Further, although the method described in the earlier application may reduce the growth of the inroad portion in comparison with the conventional method, the method described in the earlier application can not completely avoid the creation of the inroad portion. This is due to the fact that the fundamental configuration of the method described in the earlier application is substantially same as that of the conventional method, in which the bit-line oxide 13 is formed on the diffusion layer 2 via thermal oxidization. This fundamental configuration causes a situation in which the accelerated oxidization of the diffusion layer 2 induced by arsenic is competing with the diffusion of the oxygen in the lateral direction within the first insulating film 3a, and therefore the creation of the inroad portion can not completely be avoided. Thus, the method can not sufficiently address the needs for providing further miniaturization and the higher density of the nonvolatile semiconductor memory devices.

In addition, the thickness of the ONO films 3 near the edge of the bit-line oxide 13 increases due to the above-mentioned diffusion of oxygen in the lateral direction, and this increase of the thickness reduces the efficiency for generating BTBT holes, and thus deteriorates the characteristics for erasing the information electric charge, causing another problem.

Figure 10A:
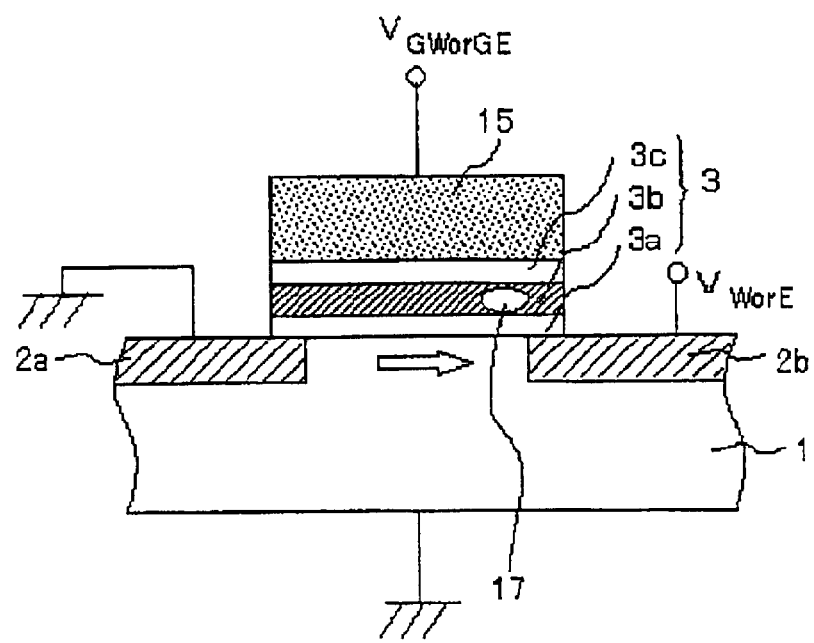
FIGS. 10A and 10B are cross sectional views of a MONOS nonvolatile semiconductor memory device, showing the writing, reading and erasing operations of the nonvolatile semiconductor memory device.
Figure 10B:
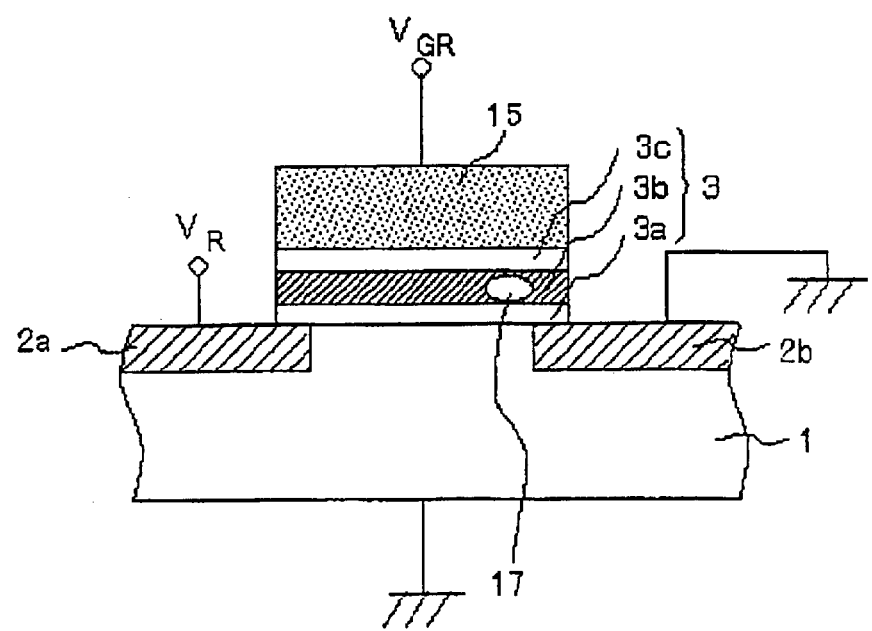

These problems will be fully described in reference to FIGS. 10A and 10B. For example, when a bias of: e.g., gate voltage of 0 V, substrate voltage of 0 V and drain voltage of 5V, is applied thereto, electrons within the gate electrode are accumulated at the interface between the gate electrode and the gate oxide film, and electrons near the interface between the diffusion layer 2 and the gate oxide film are drawn out to form a depletion layer having very thinner thickness. The width of the depletion layer considerably depends on the concentration of the impurity contained in the diffusion layer 2 and the applied voltage. When the width of the depletion layer is thin (ca. 3 nm) such that the tunneling phenomenon occurs therein, some electrons near the peak of valence band may possibly migrate through forbidden band to conduction band due to bending of the band of the depletion layer formed in the diffusion layer 2, and in such case holes are created in valence band and electrons are accumulated in conduction band. Electrons that have migrated to conduction band are drawn to the outside thereof by the drain voltage, and on the contrary, holes that have been created in valence band migrate toward the direction to the channel region. This creates holes therein via BTBT. On the contrary, under the conditions that both the concentration of the impurity contained in the diffusion layer 2 and the biasing conditions are constant, thicker ONO films 3 provides insufficient bending of the band since most of the applied voltage is accumulated in the ONO films 3, and thus the tunneling phenomenon is inhibited. Therefore, if it is desired to create more holes, i.e., if it is desired to increase the efficiency for generating BTBT holes, thinner oxide film may be formed. However, the above-mentioned method of the earlier application provides the increase of the thickness of the ONO films 3 near the edge of the bit-line oxide 13 due to the diffusion of oxygen in the lateral direction, and this reduces the efficiency for generating BTBT holes.

To address the problem, the present invention employs a process of forming a silicon layer immediately after forming the ONO films and then implanting arsenic over the formed silicon layer (or over the ONO films). This eliminates the thermal processing for forming the bit-line oxide, and consequently the generation of the bird's beak is inhibited and thus the deterioration of the characteristics of maintaining the electric charge due to the bending of the ONO films can be avoided. In addition, the method can prevent the increase of the thickness of the ONO films near the edge of the bit-line oxide 13 due to the diffusion of oxygen in the lateral direction, and this prevents the reduction of the efficiency for generating BTBT holes.

The present invention also employs a process of leaving at least the silicon layer on the ONO films of the channel region as it is. This provides a stabilized interface between the ONO films and the silicon layer, and thus improving the reliability thereof.

Further, radical oxidation of the silicon layer and/or ONO films is employed, instead of the ordinary thermal oxidation to form the bit-line oxide. This improves the breakdown voltage while inhibiting the formation of the bird's beak.

Preferred embodiments according to the present invention will be described in reference to the annexed drawings. Here, a first and a second embodiments provide examples in which the silicon layer is formed after forming the ONO films and ion is implanted over the ONO films and the silicon layer; a third embodiment provides an example in which only a portion of the silicon layer on the channel region is left and ion is implanted over the ONO films; a fourth and a fifth embodiments provide examples in which the silicon layer or the ONO layer above the diffusion layer is further oxidized to improve the withstanding voltage between the bit line and the word line; a sixth embodiment provides an example in which an effective channel length is increased; and a seventh and an eighth embodiments provide examples in which the efficiency for generating BTBT holes increases. Although the following embodiments describe utilizing ONO films for the insulating film of the multi-layer structure, the present invention is not intended to limit the disclosures of the following embodiments, and it is understood that: ON films formed by depositing a silicon oxide film and subsequently depositing a silicon nitride film; other types of multi-layer structures formed by repeatedly depositing these films or having equivalent functions thereof; or an insulating film containing silicon fine particles (silicon-nano-dot) dispersed in at least a portion of a silicon oxide film, can also similarly be employed.

First Embodiment

Figure 12A:
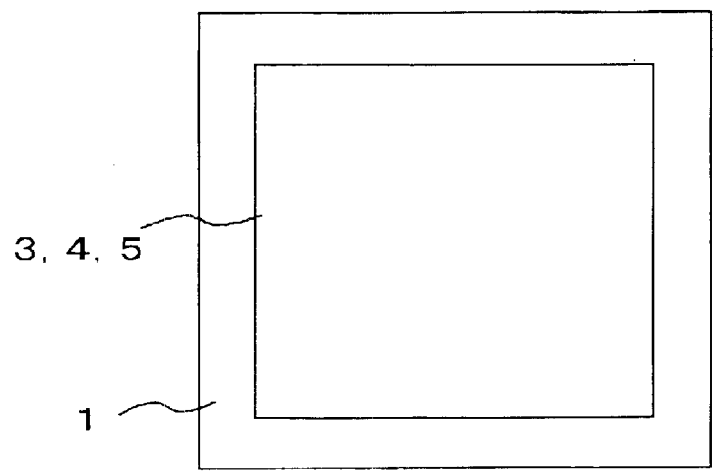
FIGS. 12A to 12C are plan views of the MONOS nonvolatile semiconductor memory device shown in FIGS. 1A to 1D.
Figure 12B:
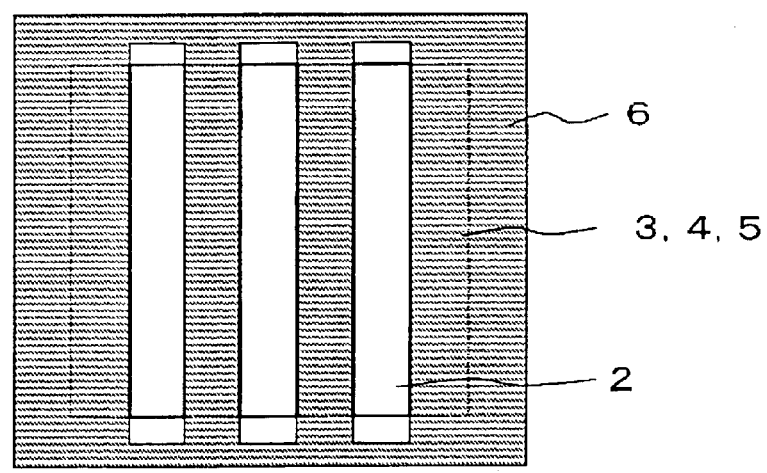
Figure 12C:
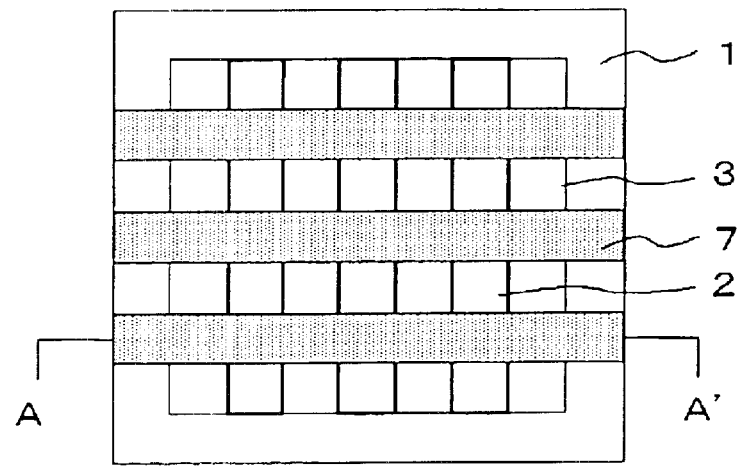

A nonvolatile semiconductor memory device and a method for manufacturing thereof according to the first embodiment of the present invention will be descried in reference to FIGS. 1A to 1D. FIGS. 1A to 1D are cross sectional views of a MONOS nonvolatile semiconductor memory device along a word line, showing the manufacturing process steps for the nonvolatile semiconductor memory device according to the first embodiment. FIGS. 12A to 12C are plan views of the MONOS nonvolatile semiconductor memory device shown in FIGS. 1A to 1D. Here, this embodiment shows the fundamental structure of the nonvolatile semiconductor memory device according to the present invention, that is, the structure in which the silicon layer is formed on the ONO films, and these layer/films are left as it is.

Figure 1A:
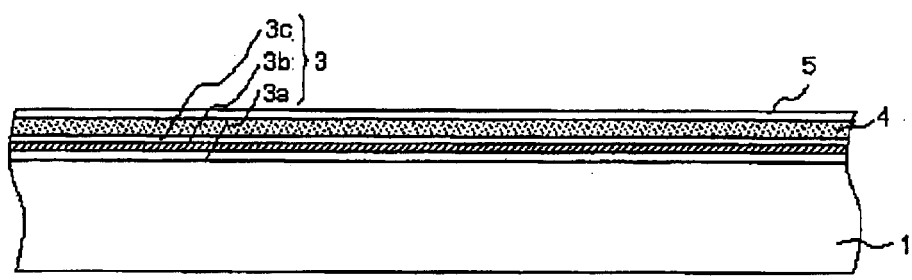
FIGS. 1A to 1D are cross sectional views of a MONOS nonvolatile semiconductor memory device, showing the manufacturing process steps for the nonvolatile semiconductor memory device according to the first embodiment of the present invention.

First, as shown in FIGS. 1A and 12A, a silicon oxide film (first insulating film 3a) having a thickness of about 4 nm is formed on a silicon substrate 1 via radical oxidization or thermal oxidization, and then a silicon nitride film (second insulating film 3b) having a thickness of about 7 nm is deposited thereon via CVD or the like, and further the surface of the deposited silicon nitride film is oxidized via radical oxidization or thermal oxidization to transform the oxidized surface into a silicon oxide film (third insulating film 3c) having a thickness of about 4 nm. Alternatively, the third insulating film 3c may be deposited thereon via CVD such as HTO (high temperature oxidization). This alternative process for forming the third insulating film 3c may be utilized in other embodiments. Thus, the ONO films 3 having a tri-layer structure of the third insulating film 3c/the second insulating film 3b/the first insulating film 3a is formed. Alternatively, if the silicon-nano-dot structure is employed, the silicon oxide film is formed via radical oxidization or thermal oxidization and thereafter silicon fine particles having diameters of about 3 to 5 nm are dispersively formed therein via CVD or the like.

Although the thickness of each of the insulating films that constitutes the ONO films 3 and the manufacturing method thereof are not particularly limited, when it is intended to generate holes by BTBT as described above, the thicker oxide film may provide smaller bending of the band, inhibiting the tunneling phenomenon. Therefore, thinner ONO films 3 may be preferable for increasing the efficiency for generating BTBT holes.

Subsequently, a film of a polycrystalline or amorphous silicon or silicon compound having a thickness of about 10 to 50 nm for the first electrical conductive layer (hereinafter referred as silicon layer 4) is deposited via CVD so as to cover the third insulating film 3c. The silicon layer 4 may be formed of: undoped or high concentration of n-type impurity-doped amorphous silicon film or polycrystalline silicon film; or polycrystalline or amorphous silicon germanium or the like. Thus, the interface between the ONO films 3 and the silicon layer 4 can be stabilized by coating the ONO films 3 with the silicon layer 4 immediately after forming the ONO films 3, thereby improving the characteristics for maintaining the information electric charge and the device reliability.

In this application, a film 5 of HTO (high temperature oxide) or LTO (low temperature oxide) having a thickness of about 10 nm may be deposited on the silicon layer 4. The film 5 may be intended for the purpose of removing a resist by utilizing a lift-off effect during an additional wet etching processing for the oxide film, when the removal of the resist becomes difficult due to the implantation of the higher concentration of arsenic.

Figure 1B:
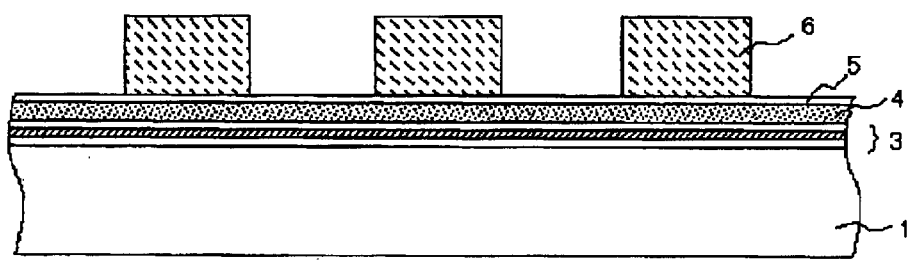

Then, as shown in FIGS. 1B and 12B, a patterned resist 6 having a slit-shaped diffusion layer-pattern is formed via a known lithography technology on the HTO or LTO 5 (or on the silicon layer 4 if no HTO or LTO 5 is disposed thereon). In FIG. 12B, the dotted defines device isolation region. Here, the above-mentioned method described in the earlier application includes depositing the silicon nitride film 16 on the silicon layer 4 before forming the patterned resist 6, and a stress created by a different in the coefficient of thermal expansion between the silicon layer 4 and the silicon nitride film 16 is utilized to inhibit the growth of the bit-line oxide 13, as shown FIGS. 11. On the contrary, the method according to this embodiment does not require forming the bit-line oxide 13, and thus the deposition of the silicon nitride film 16 can be eliminated from the manufacturing process, and thus providing more simplified manufacturing process in comparison with the method described in the earlier application.

Figure 1C:
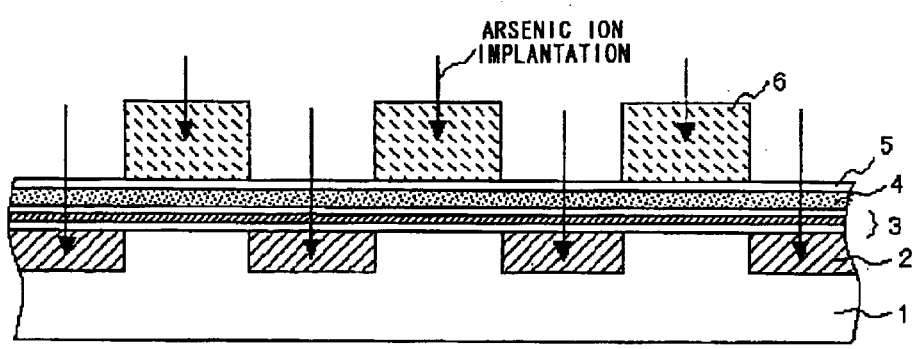

The conventional method and the method described in the earlier application include forming the opening by etching the ONO films 3 and/or the silicon layer 4 via the patterned resist 6. On the contrary, as shown in FIGS. 1C and 12B, the present example includes: directly implanting n-type impurity such as arsenic over the HTO or LTO 5, the silicon layer 4 and/or the ONO films 3 via the ion implantation mask of the patterned resist 6 without etching the HTO or LTO 5, the silicon layer 4 and/or the ONO films 3; and then, after removing the patterned resist 6, further thermally processing thereof to form a diffusion layer 2 for forming the bit line. Here, although the acceleration energies of the ion implantation depends on the thickness of the ONO films 3, the silicon layer 4, and the HTO or LTO 5, the acceleration energy may be between 100 keV to 150 keV when the total thickness of the layers is about 40 to 60 nm, for example. Thus, having the configuration of implanting ions over the silicon layer 4 and the ONO films 3 eliminates the needs for forming an additional insulating film on the diffusion layer 2, thereby preventing the generation of the bird's beak due to the thermal oxidization.

In addition, as the impurity is implanted through the silicon nitride film 3b, the portions of the silicon nitride film 3b where the impurity is implanted are transmuted or denatured by the n-type impurity such as arsenic. This forms transition interfaces in the silicon nitride film 3b between first portions of the silicon nitride film 3b where the impurity is not implanted and second portions of the silicon nitride film 3b where the impurity is implanted. Therefore, electrons are effectively trapped and confined in each of the first portions of the ONO films 3.

Figure 1D:
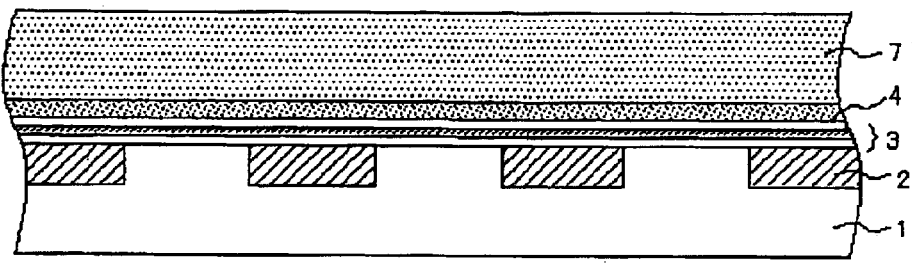

Next, as shown in FIGS. 1D and 12C, a polysilicon film having a thickness of about 50 nm and a refractory metal silicide film such as tungsten silicide film having a thickness of about 100 nm, for example, are deposited on the entire surface of the silicon substrate 1 for the second electrical conductive layer 7, and these films are processed by a known lithography technique and dry etching technique to form a slit-shape, in which the slits are perpendicular to the bit line, to form the word line. In this processing for forming the word line, the silicon layer 4 is also processed to form a gate electrode.

According to the above-mentioned method, the bit line of the NROM cell is formed by providing the diffusion layer 2 on the silicon substrate 1, and the ONO films 3 having a tri-layer structure of the third insulating film 3c/the second insulating film 3b/the first insulating film 3a forms the region for writing and erasing the information electric charge. In addition, the word line having a dual-layer structure (the first electrical conductive layer 4 and the second electrical conductive layer 7) is disposed on the ONO films 3 to form a fundamental structure of the NROM cell according to the present embodiment.

As such, the generation of the bird's beak, which is appeared in the conventional method, can be inhibited by carrying out the ion implantation through the ONO films 3 and the silicon layer 4 without forming a new insulating film on the diffusion layer 2, and the deterioration of the characteristics of maintaining the electric charge due to the altering of the band structure of the silicon nitride film can be prevented since the bending of the ONO films 3 does not occur. Further, the silicon layer 4 is formed immediately after forming the ONO films 3 and these layer/films are left as it is, so that the interface between the ONO films 3 and the silicon layer 4 is stabilized and thus the reliability thereof is improved.

Second Embodiment

A nonvolatile semiconductor memory device and a method for manufacturing thereof according to the second embodiment of the present invention will be descried in reference to FIGS. 2A to 2D. FIGS. 2A to 2D are cross sectional views of a MONOS nonvolatile semiconductor memory device, showing the manufacturing process steps for the nonvolatile semiconductor memory device according to the present embodiment. Here, this embodiment describes a structure for solving a problem occurred in the stripping processing of the resist containing higher concentration of doped arsenic, and the other features are the same as that employed in the first embodiment.

First, similarly as in the first embodiment, a first insulating film 3a is formed on a silicon substrate 1 via radical oxidization or thermal oxidization, and then a second insulating film 3b is deposited thereon via CVD or the like, and further the surface of the deposited silicon nitride film is oxidized via radical oxidization or thermal oxidization to form a third insulating film 3c, to provide the ONO films 3 having a tri-layer structure of the third insulating film 3c/the second insulating film 3b/the first insulating film 3a.

Figure 2A:
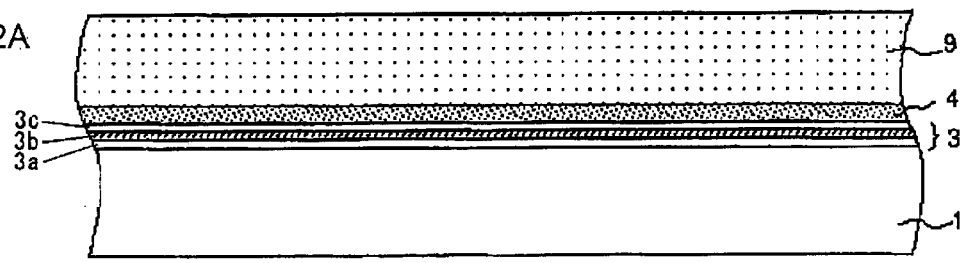
FIGS. 2A to 2D are cross sectional views of a MONOS nonvolatile semiconductor memory device, showing the manufacturing process steps for the nonvolatile semiconductor memory device according to the second embodiment of the present invention.

Next, as shown in FIG. 2A, a silicon layer is deposited to form a first electrical conductive layer 4 via CVD, and thereafter a thicker insulating film 9 (silicon oxide film or silicon nitride film) having a thickness of about 200 nm is deposited for a hard mask of the ion implantation.

Figure 2B:
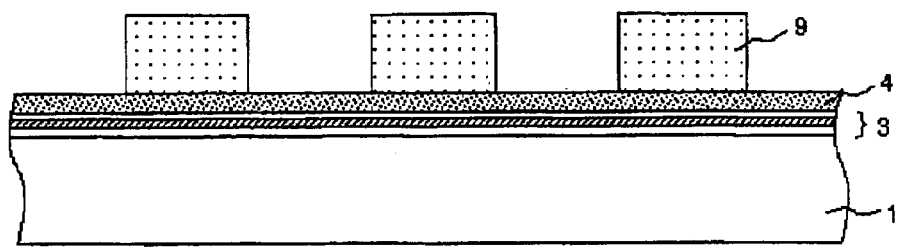

Then, a patterned resist having a slit-shaped pattern (not shown) is formed via a known lithography technique on the insulating film 9, and the exposed portions of the insulating film 9 is removed via a known dry etching technique to form a hard mask 9a that is utilized for a diffusion layer-pattern, as shown in FIG. 2B. Thereafter, the patterned resist is removed.

Figure 2C:
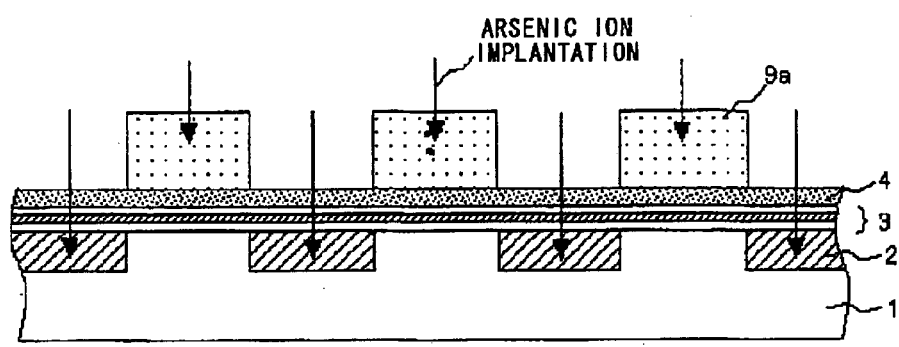
Figure 2D:
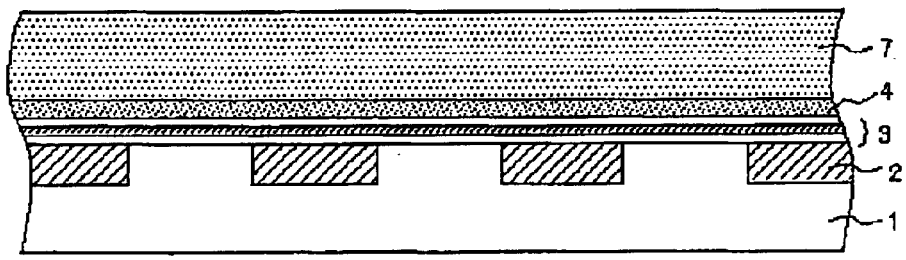

Then, as shown in FIG. 2C, n-type impurity such as arsenic is implanted directly over the silicon layer 4 via the ion-implantation mask of the hard mask 9a, and then, after removing the hard mask 9a via a known dry etching technique or wet etching technique, thermal processing is additionally conducted to form the diffusion layer 2 that serves as a bit line. As such, by employing the hard mask 9a of the insulating film 9, the stripping of the hard mask 9a after the implantation of arsenic can be easily conducted, and therefore the poor stripping of the resist can be prevented.

Similar to the first embodiment, as the impurity is implanted through the silicon nitride film 3b, the portions of the silicon nitride film 3b where the impurity is implanted are transmuted or denatured by the n-type impurity such as arsenic. This forms transition interfaces in the silicon nitride film 3b between first portions of the silicon nitride film 3b where the impurity is not implanted and second portions of the silicon nitride film 3b where the impurity is implanted.

Therefore, electrons are effectively trapped and confined in each of the first portions of the ONO films 3.

Then, similarly as in the first embodiment, a polysilicon film and a refractory metal silicide film such as tungsten silicide film, for example, are deposited on the entire surface of the silicon substrate 1 to form a second electrical conductive layer 7. Then, a known lithography technique and dry etching technique are performed on the second electrical conductive layer 7 to form a word line. Thus, the fundamental structure of the NROM cell according to the present embodiment is obtained.

As such, according to the method of the present embodiment, it is advantageous that the poor stripping of the resist after the implantation of ions can be prevented by having the configuration of employing the hard mask 9a of the insulating film 9 for the mask of the ion implantation, in stead of employing the patterned resist, in addition to the advantageous effect obtained in the first embodiment.

Third Embodiment

A nonvolatile semiconductor memory device and a method for manufacturing thereof according to the third embodiment of the present invention will be descried in reference to FIGS. 3A to 3E. FIGS. 3A to 3E are cross sectional views of a MONOS nonvolatile semiconductor memory device, showing the manufacturing process steps for the nonvolatile semiconductor memory device according to the present embodiment. Here, this embodiment is characterized in that the implantation of higher concentration of arsenic is conducted through the ONO films, and the other features are the same as that employed in the second embodiment.

First, similarly as in the second embodiment, a silicon oxide film, a silicon nitride film and a silicon oxide film are subsequently deposited on a silicon substrate 1 to form an ONO films 3. Next, a silicon layer 4 is deposited to form a first electrical conductive layer, and thereafter an insulating film 9 (silicon oxide film or silicon nitride film) is deposited for a hard mask of the ion implantation (see FIG. 3A).

Figure 3A:
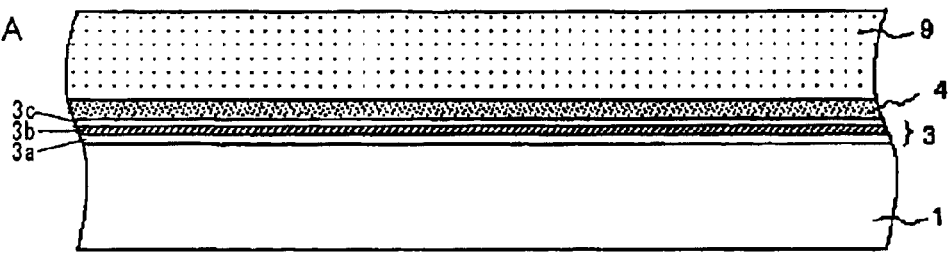
FIGS. 3A to 3E are cross sectional views of a MONOS nonvolatile semiconductor memory device, showing the manufacturing process steps for the nonvolatile semiconductor memory device according to the third embodiment of the present invention.
Figure 3B:
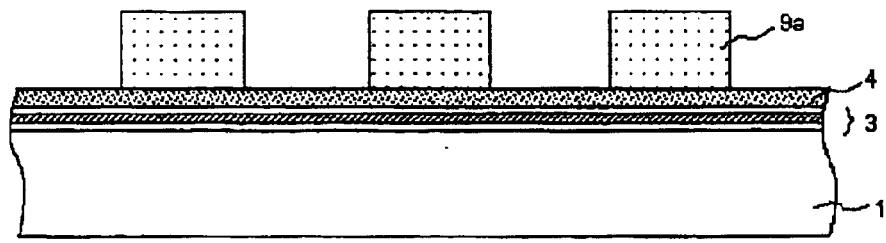

Then, a patterned resist having a slit-shaped pattern (not shown in the drawings) is formed via a known lithography technique on the insulating film 9. Then, a hard mask 9a that is utilized for a diffusion layer-pattern is formed via a known dry etching technique, and thereafter, the patterned resist is removed, as shown in FIG. 3B.

Figure 3C:
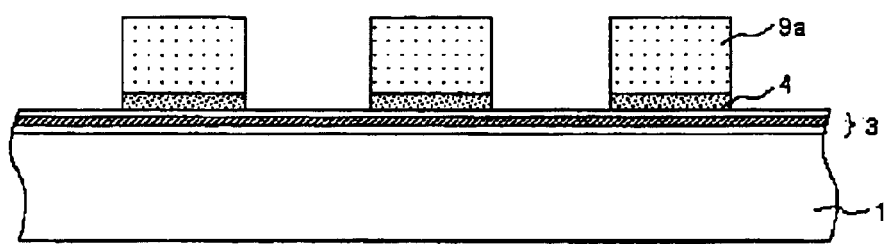
Figure 3D:
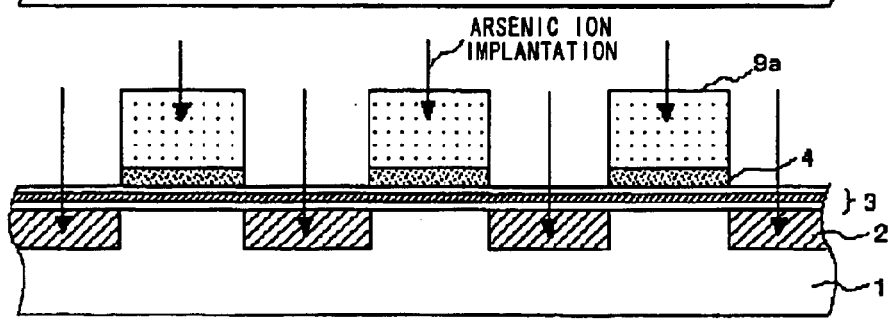

Then, as shown in FIG. 3C, the exposed portion of the silicon layer 4 is removed via the hard mask 9a by a known dry etching technique, and subsequently, as shown in FIG. 3D, n-type impurity such as arsenic is implanted over the ONO films 3 via the ion implantation mask of the hard mask 9a, an then, after removing the hard mask 9a via a known dry etching technique, thermal processing is additionally conducted to form a diffusion layer 2 for forming the bit line. In the first and second embodiments, accelerated energy for ionization is required to be higher since the implantation of arsenic is conducted through the silicon layer 4. On the contrary in this embodiment, the required accelerated energy can be reduced, since the silicon layer 4 of the region for forming the diffusion layer has been removed, and consequently thinner hard mask can be employed, so that the processing of removing the hard mask is simplified (required duration is reduced). In this embodiment, although the acceleration energies of the ion implantation depends on the thickness of the ONO films 3, the acceleration energy may be between 50 keV to 80 keV when the total thickness of the layers is about 15 to 30 nm, for example.

It should be noted that the silicon layer on the channel region remains, and thus the stability of the interface between the ONO films 3 and the silicon layer 4 in this region can be maintained.

Similar to the first and second embodiments, as the impurity is implanted through the silicon nitride film 3b, the portions of the silicon nitride film 3b where the impurity is implanted are transmuted or denatured by the n-type impurity such as arsenic. This forms transition interfaces in the silicon nitride film 3b between first portions of the silicon nitride film 3b where the impurity is not implanted and second portions of the silicon nitride film 3b where the impurity is implanted. Therefore, electrons are effectively trapped and confined in each of the first portions of the ONO films 3.

Figure 3E:
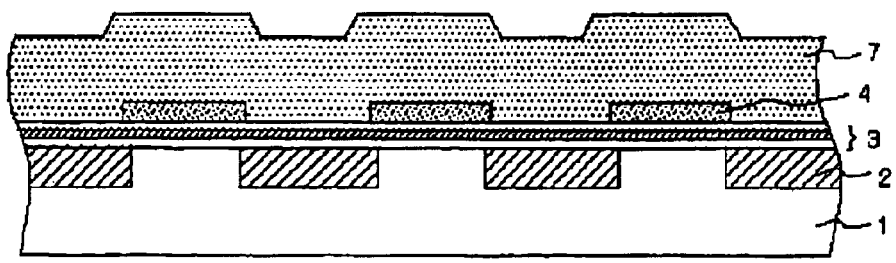

Then, as shown in FIG. 3E, a polysilicon and a refractory metal silicide such as tungsten silicide are deposited on the entire surface of the silicon substrate 1 to form a second electrical conductive layer 7. Then, a known lithography technique and dry etching technique are performed on the second electrical conductive layer 7 to form a word line. Thus, the fundamental structure of the NROM cell according to the present embodiment in obtained. Here, since the silicon layer 4 is remained for the purpose of stabilizing the interface between the ONO films 3 and the silicon layer 4, the thickness of the electrical conductive layer in the diffusion layer region is different from the thickness of that in the channeling region. Alternatively, the silicon layer 4 can be thinner or removed via dry etching technique before forming the second electrical conductive layer 7, and this configuration improves the flatness thereof.

As such, according to the method of the present embodiment, it is advantageous that the accelerated energy for the ion implantation can be reduced by having the configuration of removing the silicon layer 4 in the diffusion layer-forming region before conducting the ion implantation, in addition to the advantageous effect obtained in the second embodiment.

Fourth Embodiment

A nonvolatile semiconductor memory device and a method for manufacturing thereof according to the fourth embodiment of the present invention will be descried in reference to FIGS. 4A to 4E. FIGS. 4A to 4E are cross sectional views of a MONOS nonvolatile semiconductor memory device, showing the manufacturing process steps for the nonvolatile semiconductor memory device according to the present embodiment. Here, this embodiment is characterized in that the withstand voltage between the bit line and the word line is improved and the parasitic capacitance is reduced, and the other features are the same as that employed in the second embodiment.

Figure 4A:
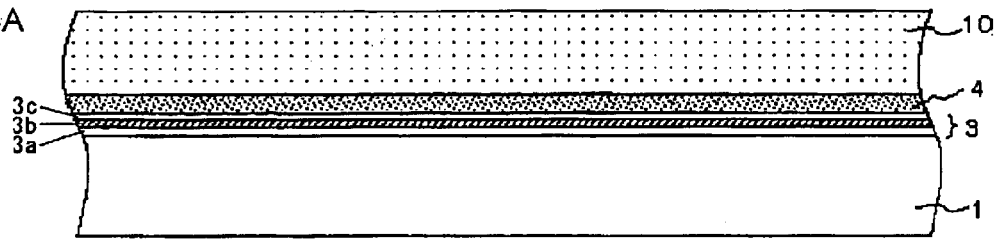
FIGS. 4A to 4E are cross sectional views of a MONOS nonvolatile semiconductor memory device, showing the manufacturing process steps for the nonvolatile semiconductor memory device according to the fourth embodiment of the present invention.

First, as shown in FIG. 4A, a silicon oxide film, a silicon nitride film and a silicon oxide film are subsequently deposited on a silicon substrate 1 to form an ONO films 3. Next, a silicon layer 4 is deposited to form a first electrical conductive layer 4 via CVD, and thereafter a thicker silicon nitride film 10 having a thickness of about 200 nm is deposited for a hard mask of the ion implantation. In this embodiment, new numerical number 10 for indicating the silicon nitride film is newly assigned, since the hard mask (silicon nitride film) is employed for the oxidization of the silicon layer 4.

Figure 4B:
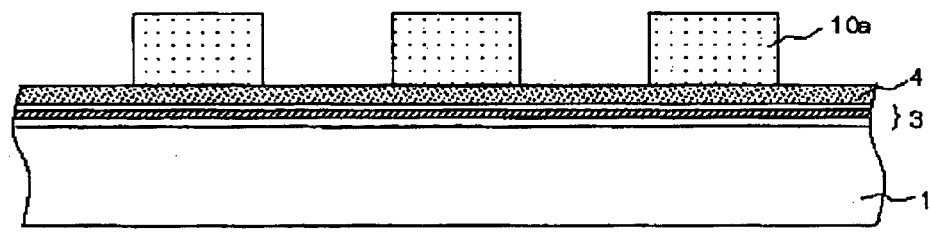

Then, a patterned resist having a slit-shaped pattern (not shown in the drawings) is formed via a known lithography technique on the silicon nitride film 10 to form a hard mask 10a that is utilized for a diffusion layer-pattern via a known dry etching technique, and thereafter, the patterned resist is removed, as shown in FIG. 4B.

Figure 4C:
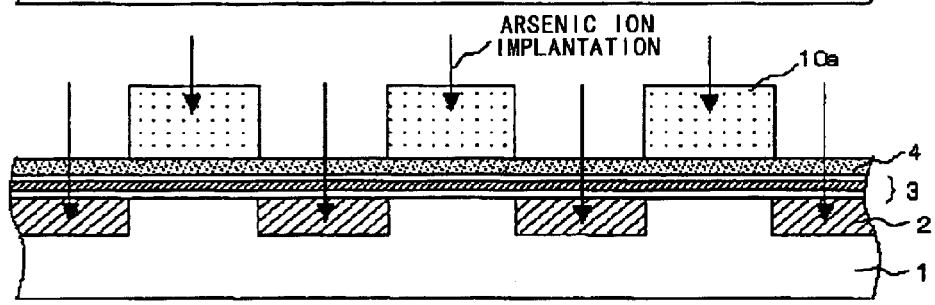
Figure 4D:
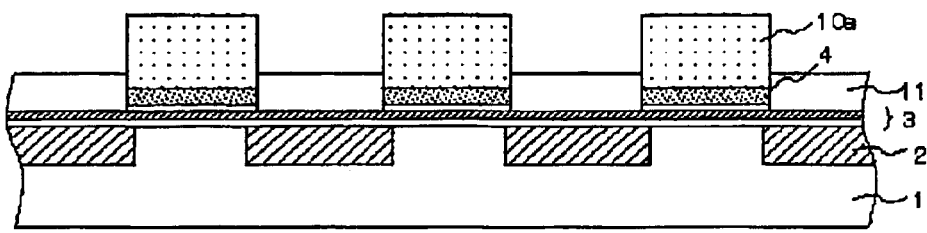

Then, as shown in FIG. 4C, n-type impurity such as arsenic is implanted directly over the silicon layer 4 via the ion-implantation mask of the hard mask 10a, and thermal processing is conducted to form the diffusion layer 2 for forming the bit line.

Similar to the first embodiment, as the impurity is implanted through the silicon nitride film 3b, the portions of the silicon nitride film 3b where the impurity is implanted are transmuted or denatured by the n-type impurity such as arsenic. This forms transition interfaces in the silicon nitride film 3b between first portions of the silicon nitride film 3b where the impurity is not implanted and second portions of the silicon nitride film 3b where the impurity is implanted. Therefore, electrons are effectively trapped and confined in each of the first portions of the ONO films 3.

In the method of the second embodiment, the hard mask 9a (see FIG. 3D) is removed and the formation of the second electrical conductive layer 7 is conducted. On the contrary, in this embodiment, the silicon layer 4 is oxidized via thermal oxidization to form a polysilicon oxide film 11 above the diffusion layer 2, in order to improve the withstand voltage between the bit line and the word line and to reduce the parasitic capacitance (see FIG. 4D). In this occasion, oxide species from the third insulating film 3c of the ONO films 3 and the polysilicon oxide film 11 enter into the silicon layer 4 of the channel region to form unwanted small bird's beak therein. Nevertheless, since the duration time for forming the bird's beak in this example is considerably shorter than that of the conventional method, this will not cause a practical problem.

Figure 4E:
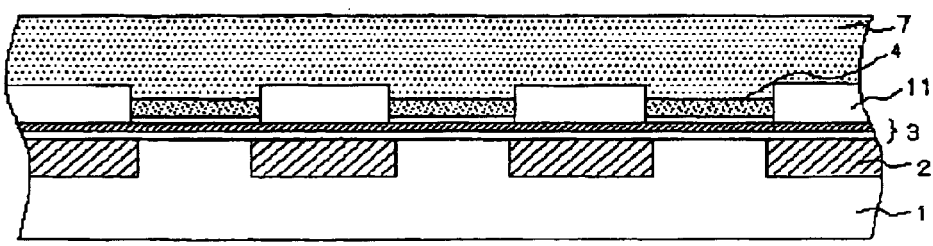

Then, as shown in FIG. 4E, a polysilicon and a refractory metal silicide such as tungsten silicide are deposited on the entire surface of the silicon substrate 1 to form a second electrical conductive layer 7. Then, a known lithography technique and dry etching technique are performed on the second electrical conductive layer 7 to form a word line. Thus, the fundamental structure of the NROM cell according to the present embodiment is obtained.

As such, according to the method of the present embodiment, the generation of the bird's beak is inhibited by eliminating the process of directly thermally oxidizing the diffusion layer 2, and the withstand voltage between the bit line and the word line is improved and the parasitic capacitance is reduced by having the configuration of oxidizing the silicon layer 4 in the diffusion layer region to form the polysilicon oxide layer 11, instead of the third insulating film 3a of the ONO films 3.

Fifth Embodiment

A nonvolatile semiconductor memory device and a method for manufacturing thereof according to the fifth embodiment of the present invention will be descried in reference to FIGS. 5A to 5E. FIGS. 5A to 5E are cross sectional views of a MONOS nonvolatile semiconductor memory device, showing the manufacturing process steps for the nonvolatile semiconductor memory device according to the present embodiment. Here, this embodiment is characterized in that the silicon nitride film doped with higher concentration of arsenic, in which Si—N bond is weakened, is oxidized, and the other features are the same as that employed in the fourth embodiment.

First, similarly as in the fourth embodiment, a silicon oxide film, a silicon nitride film and a silicon oxide film are subsequently deposited on a silicon substrate 1 to form an ONO films 3. Next, a silicon layer 4 is deposited to form a first electrical conductive layer 4 via CVD, and thereafter a silicon nitride film 10 is deposited for a hard mask of the ion implantation (see FIG. 5A).

Then, a patterned resist (not shown in the drawings) having a slit-shaped pattern is formed via a known lithography technique on the silicon nitride film 10. Then, a known dry etching technique is performed on the silicon nitride film 10 to form a hard mask 10a. Thereafter, the patterned resist is removed. Subsequently, n-type impurity such as arsenic is implanted directly over the silicon layer 4 via the ion-implantation mask of the hard mask 10a, and thermal processing is conducted thereto to form the diffusion layer 2 for forming the bit line (see FIGS. 5B and 5C).

Figure 5A:
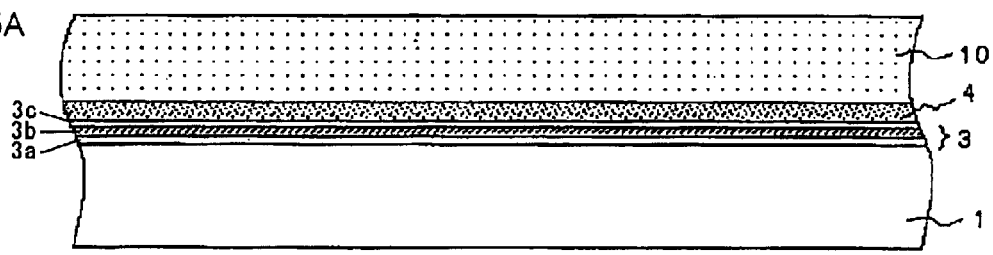
FIGS. 5A to 5E are cross sectional views of a MONOS nonvolatile semiconductor memory device, showing the manufacturing process steps for the nonvolatile semiconductor memory device according to the fifth embodiment of the present invention.
Figure 5B:
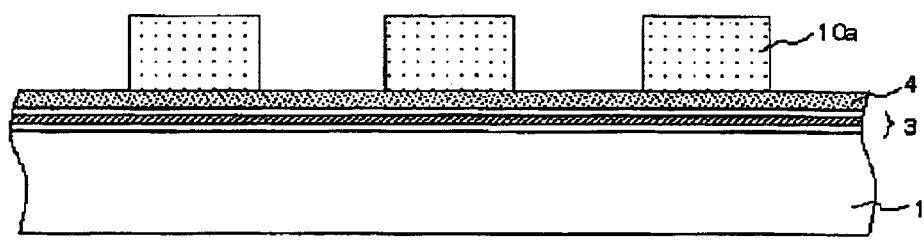
Figure 5C:
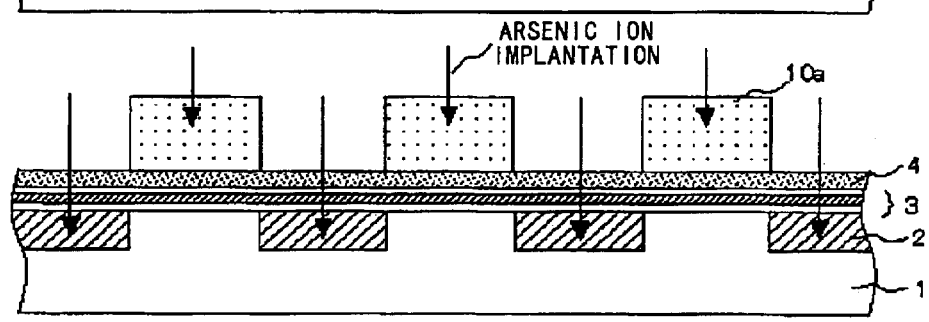
Figure 5D:
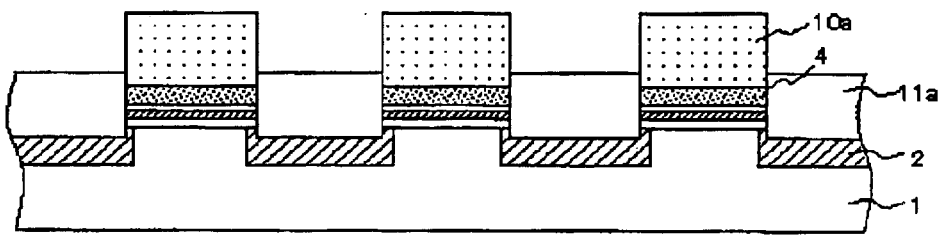

In the method of the fourth embodiment, the silicon layer 4 is oxidized via thermal oxidization to form a polysilicon oxide film 11. However, the ion is implanted therein through the ONO films 3, and thus Si—N bond in the silicon nitride film of the ONO films 3 has been weakened because the silicon nitride film is doped with higher concentration of arsenic. To solve the problem, the present embodiment employs the configuration of forming a polysilicon oxide film 11a having greater thickness than that of the fourth embodiment by proceeding the oxidization until oxidizing not only the silicon layer 4 but also the silicon nitride film during the oxidization process for the silicon layer 4, as shown in FIG. 5D. Here, the oxidization may be conducted by using a radical oxidization technique, and in such case, activated oxygen generated by the radical oxidization may be utilized to adjust the rate of oxidizing silicon layer 4 to be substantially same as the rate of oxidizing silicon nitride film, such that the duration time required for the oxidization can be reduced to inhibit the generation of the bird's beak to the fullest extent. With this polysilicon oxide film 11a, electrons are effectively trapped and confined in each of the portions of the ONO films 3.

Figure 5E:
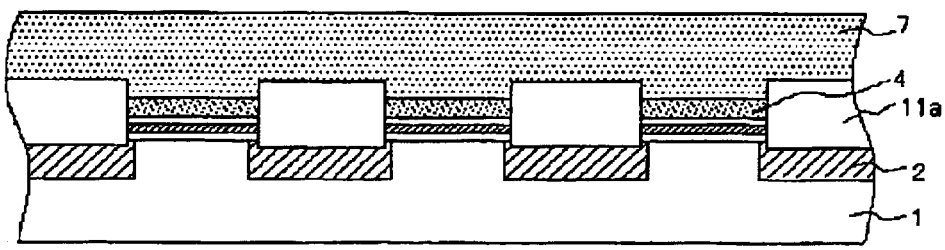

Then, as shown in FIG. 5E, a polysilicon and a refractory metal silicide such as tungsten silicide are deposited on the entire surface thereof to form a second electrical conductive layer 7. Then, a known lithography technique and dry etching technique are performed on the second electrical conductive layer 7 to form a word line. Thus, the fundamental structure of the NROM cell according to the present embodiment is obtained.

As such, according to the method of the present embodiment, the withstand voltage between the bit line and the word line is improved and the parasitic capacitance is further reduced, by having the configuration of forming the polysilicon oxide film 11a having greater thickness than that of the fourth embodiment on the diffusion layer region.

Sixth Embodiment

A nonvolatile semiconductor memory device and a method for manufacturing thereof according to the sixth embodiment of the present invention will be descried in reference to FIGS. 6A to 6E. FIGS. 6A to 6E are cross sectional views of a MONOS nonvolatile semiconductor memory device, showing the manufacturing process steps for the nonvolatile semiconductor memory device according to the present embodiment. Here, this embodiment is characterized in that the dimension of the diffusion layer region is controlled, and the other features are the same as that employed in the fourth embodiment.

First, similarly as in the fourth embodiment, a silicon oxide film, a silicon nitride film and a silicon oxide film are subsequently deposited on a silicon substrate 1 to form an ONO films 3. Subsequently, a silicon layer 4 is deposited to form a first electrical conductive layer via CVD, and thereafter a silicon nitride film 10 is deposited for a hard mask of the ion implantation. Next, a patterned resist having a slit-shaped pattern is formed via a known lithography technique on the silicon nitride film 10, and a hard mask 10a for a diffusion layer-pattern is formed via a known dry etching technique, and thereafter, the patterned resist is removed (see FIG. 6A).

In the method of the fourth embodiment, the implantation of arsenic ions is conducted via the mask of the hard mask 10a. However, the method of the fourth embodiment may possibly create insufficient channel length when miniaturization of the nonvolatile semiconductor memory device is required, and may eventually possibly induce a punch-through therein. The present embodiment employs the configuration of depositing a silicon nitride film on the entire surface of the silicon substrate 1 via CVD or the like and then etching the deposited silicon nitride film back to form sidewall nitride films 12 having a thickness of about 20 to 50 nm on the sidewalls of the hard mask 10a, thereby controlling the dimension of the diffusion layer region (see FIG. 6B).

Figure 6A:
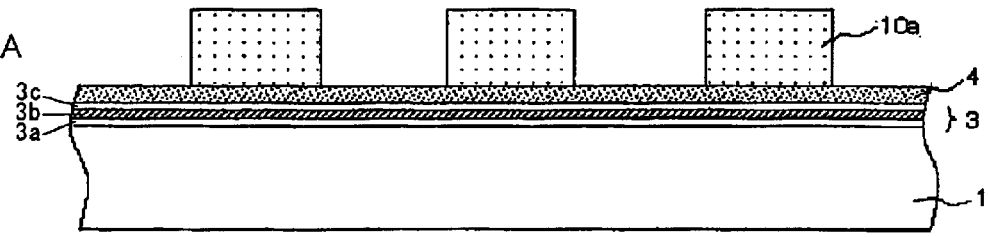
FIGS. 6A to 6E are cross sectional views of a MONOS nonvolatile semiconductor memory device, showing the manufacturing process steps for the nonvolatile semiconductor memory device according to the sixth embodiment of the present invention.
Figure 6B:
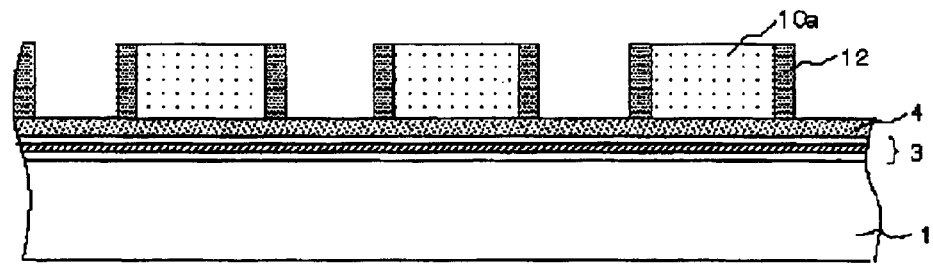
Figure 6C:
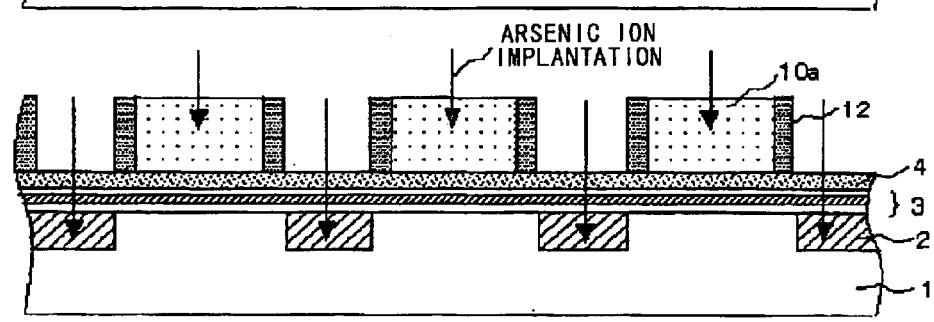

Then, as shown in FIG. 6C, n-type impurity such as arsenic is implanted over the silicon layer 4 via the ion-implantation mask of the hard mask 10a and the sidewall nitride films 12, and thermal processing is conducted to form the diffusion layer 2 for forming the bit line. The length of the diffusion layer 2 may be set to arbitrary length by selecting the thickness of the sidewall nitride film 12.

Similar to the first embodiment, as the impurity is implanted through the silicon nitride film 3b, the portions of the silicon nitride film 3b where the impurity is implanted are transmuted or denatured by the n-type impurity such as arsenic. This forms transition interfaces in the silicon nitride film 3b between first portions of the silicon nitride film 3b where the impurity is not implanted and second portions of the silicon nitride film 3b where the impurity is implanted. Therefore, electrons are effectively trapped and confined in each of the first portions of the ONO films 3.

Figure 6D:
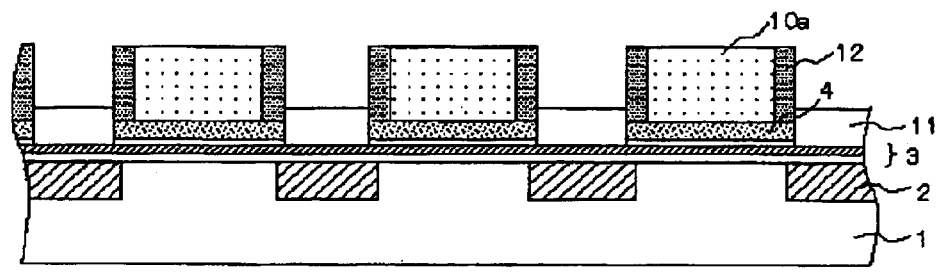
Figure 6E:
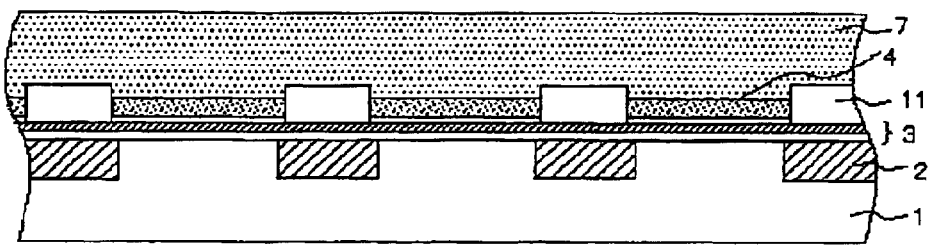

Then, as shown in FIG. 6D, the silicon layer 4 sandwiched by the two sidewall nitride films 12 is oxidized by thermal oxidization to form a polysilicon oxide film 11, and thereafter the hard mask 10a and the sidewall nitride films 12 are removed by a wet etching, and then, as shown in FIG. 6E, a polysilicon and a refractory metal silicide such as tungsten silicide are deposited on the entire surface of the silicon substrate 1 to form a second electrical conductive layer 7. Then, a known lithography technique and dry etching technique are performed on the second electrical conductive layer 7 to form a word line. Thus, the fundamental structure of the NROM cell according to the present embodiment is obtained. The polysilicon oxide film 11 shown in FIG. 6D may not be formed, and a configuration of leaving the silicon layer 4 may be employed.

As such, according to the method of the present embodiment, it is advantageous that the target region for doping arsenic can be advantageously limited by the sidewall nitride films 12, thereby increasing the practical channel length and inhibiting the generation of the punch-through, in addition to the advantageous effect obtained in the fourth embodiment.

Seventh Embodiment

A nonvolatile semiconductor memory device and a method for manufacturing thereof according to the seventh embodiment of the present invention will be descried in reference to FIGS. 7A to 7E. FIGS. 7A to 7E are cross sectional views of a MONOS nonvolatile semiconductor memory device, showing the manufacturing process steps for the nonvolatile semiconductor memory device according to the present embodiment. Here, this embodiment is characterized in that the thickness of the insulating film in the diffusion layer region is reduced to improve the efficiency for creating BTBT holes.

Figure 7A:
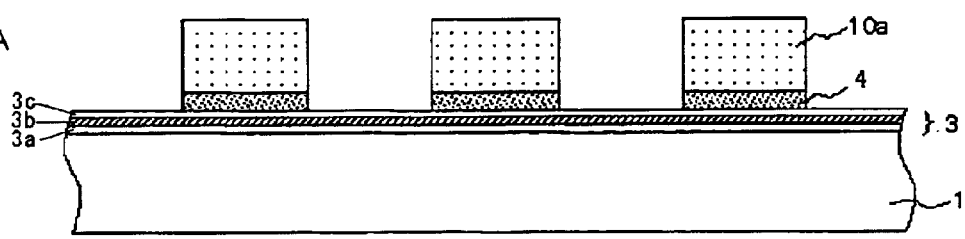
FIGS. 7A to 7E are cross sectional views of a MONOS nonvolatile semiconductor memory device, showing the manufacturing process steps for the nonvolatile semiconductor memory device according to the seventh embodiment of the present invention.

First, as shown in FIG. 7A, a silicon oxide film, a silicon nitride film and a silicon oxide film are subsequently deposited on a silicon substrate 1 to form an ONO films 3. Subsequently, a silicon layer 4 is deposited to form a first electrical conductive layer via CVD, and thereafter a silicon nitride film is deposited. Next, a patterned resist having a slit-shaped pattern is formed via a known lithography technique on the silicon nitride film, and then, a known dry etching technique is performed on the silicon nitride film to form a hard mask 10a for a diffusion layer-pattern. Thereafter, the patterned resist is removed. Then, the exposed portion of the silicon layer 4 is removed via the hard mask 10a by a known dry etching technique.

Figure 7B:
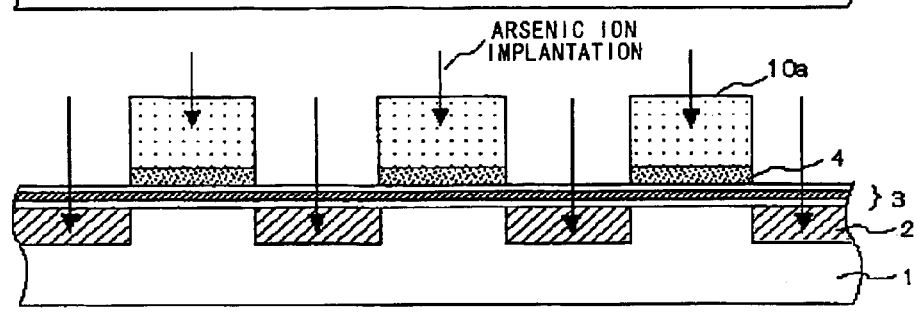

Then, as shown in FIG. 7B, n-type impurity such as arsenic is implanted over the ONO films 3 via the ion-implantation mask of the hard mask 10a, and thermal processing is conducted to form the diffusion layer 2 for forming the bit line. In this case, for the purpose of inhibiting the multiplicative oxidization of arsenic occurred in the subsequent process for forming an oxide film on the diffusion layer 2, it is preferable to sufficiently conduct an annealing process after the ion implantation.

Figure 7C:
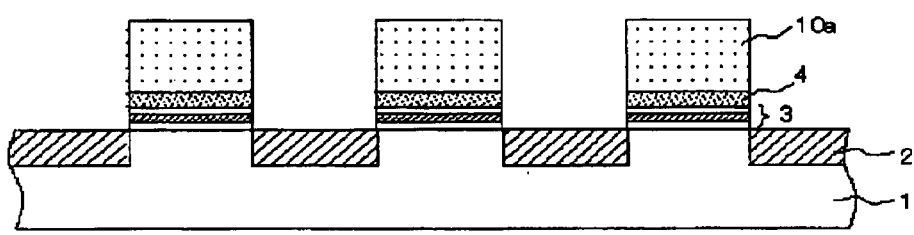

In the case of the aforementioned preferred embodiment according to the present invention, at least the ONO films 3 is not removed and is left, and under the conditions that both the concentration of the impurity contained in the diffusion layer 2 and the biasing conditions are constant, thicker ONO films 3 provides insufficient bending of the band since most of the applied voltage is accumulated in the ONO films 3, and thus the tunneling phenomenon is inhibited and the efficiency for generating BTBT holes is reduced. The present embodiment employs the configuration of partially removing the ONO films 3 by using the hard mask 10a via a known dry etching technique, as shown in FIG. 7C. Since portions of the silicon layer 4 and the ONO films 3 above the channel remains, the stability of the interfaces among the silicon substrate 1 and the ONO films 3 and silicon layer 4 in this region can be maintained.

Figure 7D:
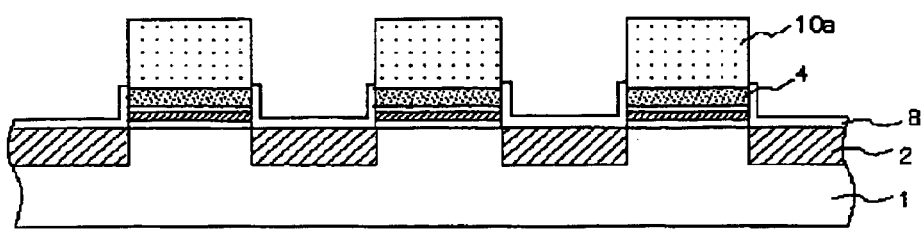
Figure 7E:
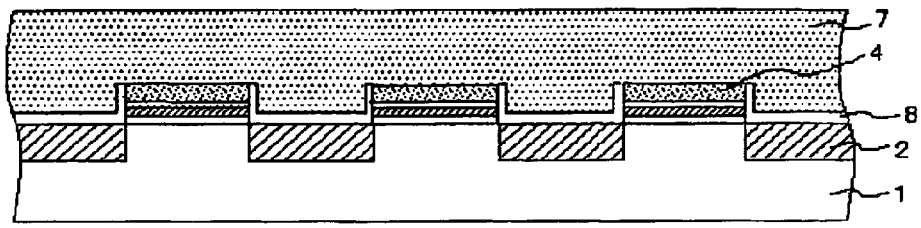

Next, as shown in FIG. 7D, an oxide film 8 having thinner thickness than that of ONO films 3 is formed on at least the upper surface of the diffusion layer and the sidewalls of the ONO films 3 and the silicon layer 4. This allows inducing the tunneling phenomenon at lower applied voltage, thereby increasing the efficiency for generating BTBT holes. In addition, with this oxide film 8, electrons are effectively trapped and confined in each of the portions of the ONO films 3. Then, as shown in FIG. 7E, the hard mask 10a is wet etched, and thereafter, a polysilicon and a refractory metal silicide such as tungsten silicide are deposited on the entire surface thereof to form a second electrical conductive layer 7. Then, a known lithography technique and dry etching technique is performed on the second electrical conductive layer 7 to form a word line. Thus, the fundamental structure of the NROM cell according to the present embodiment is obtained.

As such, according to the method of the present embodiment, portions of the ONO films 3 on the diffusion layer 2 is removed and instead the oxide films that is thinner than the ONO films 3 is formed thereon, so that the efficiency for generating BTBT holes is increased. Although the thermal oxidization is employed for forming the oxide film on the diffusion layer 2, the thickness thereof is smaller and thus the generation of the bird's beak is inhibited.

Eighth Embodiment

A nonvolatile semiconductor memory device and a method for manufacturing thereof according to the eighth embodiment of the present invention will be descried in reference to FIGS. 8A to 8E. FIGS. 8A to 8E are cross sectional views of a MONOS nonvolatile semiconductor memory device, showing the manufacturing process steps for the nonvolatile semiconductor memory device according to the present embodiment. Here, this embodiment is characterized in that the ion implantation of arsenic is conducted after an oxide film is formed, and the other features are the same as that employed in the seventh embodiment.

First, similarly as in the seventh embodiment, a silicon oxide film, a silicon nitride film and a silicon oxide film are subsequently deposited on a silicon substrate 1 to form an ONO films 3. Subsequently, a silicon layer 4 is deposited to form a first electrical conductive layer via CVD, and thereafter a silicon nitride film is deposited. Next, a patterned resist having a slit-shaped pattern is formed via a known lithography technique on the silicon nitride film, and then, a known dry etching technique is performed on the silicon nitride film to form a hard mask 10*a* for a diffusion layer-pattern. Thereafter, the patterned resist is removed. Then, the exposed portion of the silicon layer 4 is removed by a known dry etching technique (see FIG. 8A).

Figure 8A:
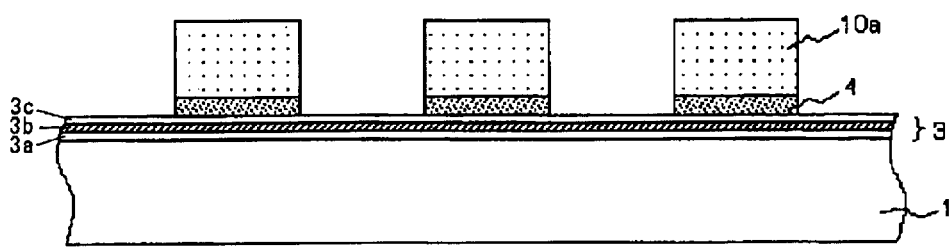
FIGS. 8A to 8E are cross sectional views of a MONOS nonvolatile semiconductor memory device, showing the manufacturing process steps for the nonvolatile semiconductor memory device according to the eighth embodiment of the present invention.
Figure 8B:
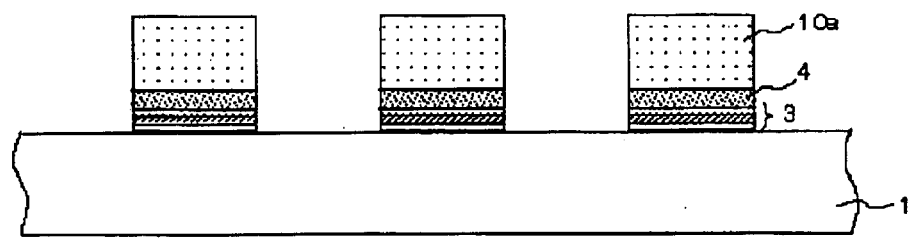
Figure 8C:
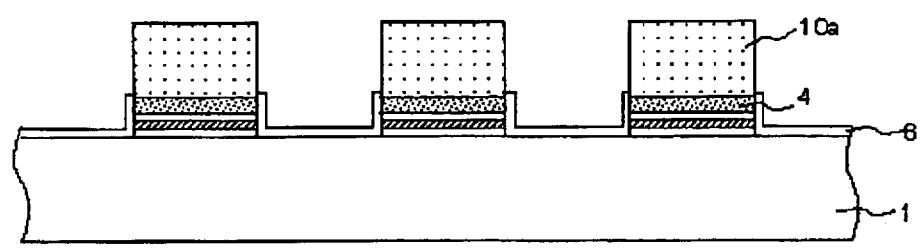

In the case of the seventh embodiment, ion implantation of arsenic is conducted at this stage. However, when oxide film is formed after implanting arsenic, the thickness of the formed film may possibly be difficult to be controlled. In this embodiment, as shown in FIG. 8B, the ONO films 3 is etched off via the hard mask 10*a* by a known dry etching technique, and consecutively, as shown in FIG. 8C, an oxide film 8 having smaller thickness than that of ONO films 3 is formed by the thermal oxidation on at least the upper surface of the diffusion layer and the sidewalls of the ONO films 3 and the silicon layer 4. With this oxide film 8, electrons are effectively trapped and confined in each of the portions of the ONO films 3.

Figure 8D:
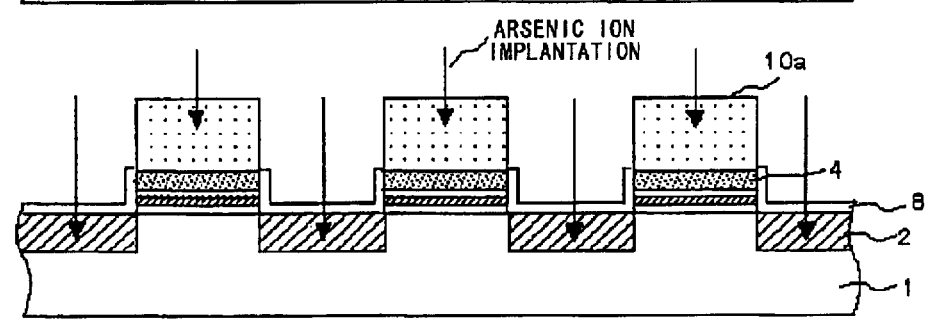

Then, as shown in FIG. 8D, n-type impurity such as arsenic is implanted over the oxide film 8 via the ion-implantation mask of the hard mask 10*a*, and thermal processing is conducted to form the diffusion layer 2 for forming the bit line. In this occasion, in order to prevent diffusion of arsenic, annealing may preferably be carried out within a nitrogen or oxygen atmosphere at a temperature equal to or lower than 950 degree C.

Figure 8E:
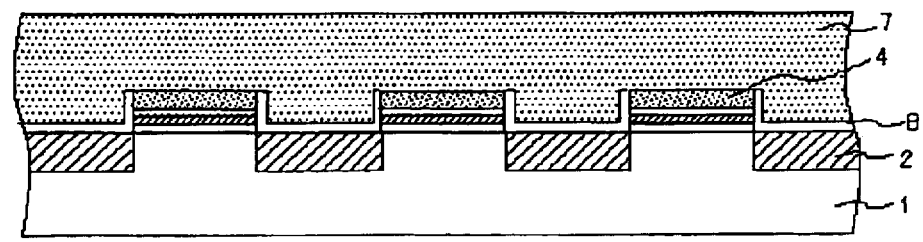
Figure 9A:
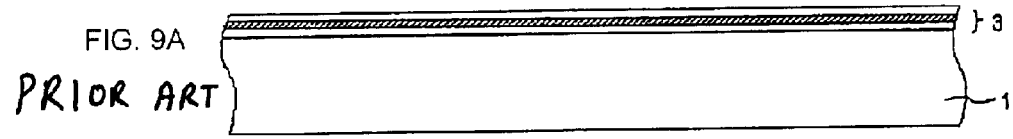
FIGS. 9A to 9E are cross sectional views of a MONOS nonvolatile semiconductor memory device, showing the manufacturing process steps for the nonvolatile semiconductor memory device according to the conventional method.
Figure 9B:
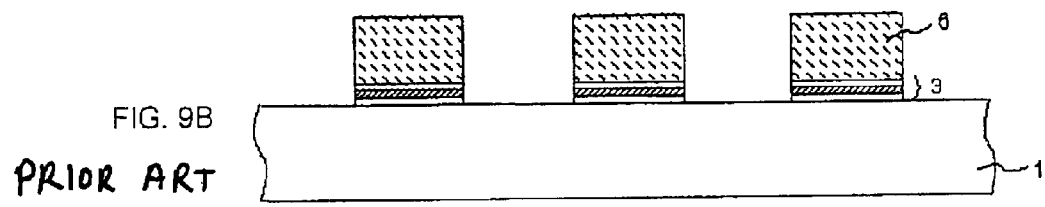
Figure 9C:
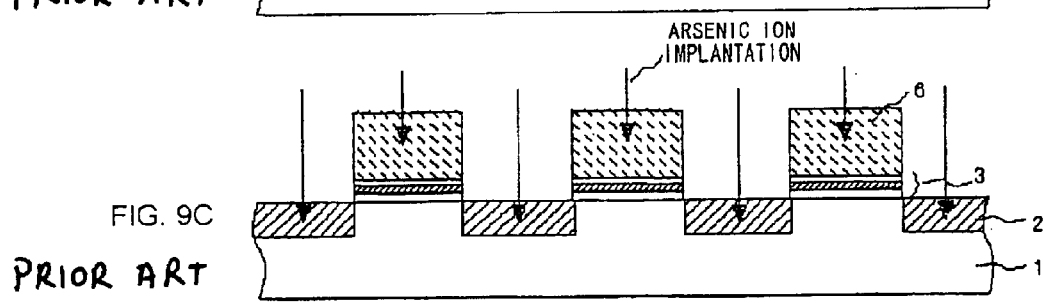
Figure 9D:
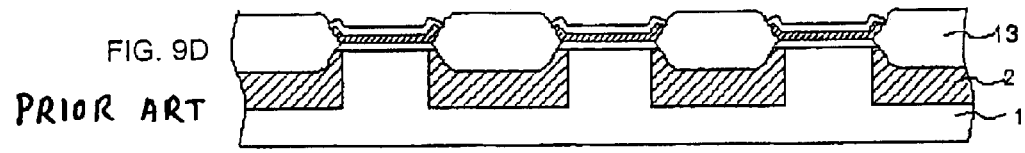
Figure 9E:
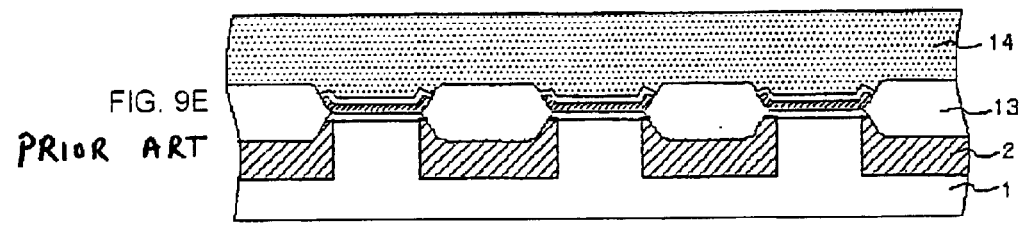

Then, as shown in FIG. 8E, the hard mask 10*a* is wet etched, and thereafter, a polysilicon and a refractory metal silicide such as tungsten silicide are deposited on the entire surface thereof to form a second electrical conductive layer 7. Then, a known lithography technique and dry etching technique are performed on the second electrical conductive layer 7 to form a word line. Thus, the fundamental structure of the NROM cell according to the present embodiment is obtained.

As such, according to the method of the present embodiment, implantation of arsenic ions is conducted after forming the oxide film 8 having smaller thickness than that of ONO films 3 on the diffusion layer 2, and thus providing the more controllable formation of the oxide film 8 in which the formed film thickness is controllable in than in the seventh embodiment.

As described above, the MNOS or MONOS nonvolatile semiconductor memory device and the method for manufacturing thereof according to the present invention provide the following advantageous effects.

First advantageous effect of the present invention is to inhibit the generation of the bird's beak that has been a problem in the conventional method, so that the limitation to the miniaturization of the NROM cell is liberalized. In any of the described embodiments except the fifth embodiment, the surface of the bit line is not directly oxidized, and in addition in the fifth embodiment, the duration for oxidization is reduced by employing radical oxidization.

In addition, generation of bending due to the bird's beak (a mechanical stress) is inhibited to provide the flat structure of the silicon nitride film that functions as the layer for accumulating electric charge, and thus the characteristics of maintaining the electric charge in improved. Further, since the method can eliminate the formation of the silicon nitride film on the silicon layer, unlike the method described in the earlier application, complicating of the manufacturing process can be avoided.

Second advantageous effect of the present invention is to improve the interface characteristic (reliability) between the word line and the ONO films. The advantageous effect is obtainable by having the configuration in which the silicon layer for forming a part of the word line is formed just after forming the ONO films, and at least the portion of the silicon layer in the channel region is remained without being etched off.

Third advantageous effect of the present invention is to improve the withstanding voltage between the bit line and the word line, thereby reducing the parasitic capacitance. In the fourth, fifth and sixth embodiments of the present invention, the oxide layer is formed above the bit line region by oxidizing the silicon via thermal oxidation or radical oxidization.

Fourth advantageous effect of the present invention is to prevent the generation the punch-through that is often induced in the course of achieving the miniaturization. In the sixth embodiment of the present invention, arsenic is implanted, after forming the sidewall nitride films on the sidewalls of the hard mask, so that the target region for implanting arsenic is precisely controllable, and the practical channel length is extended by generally twice as the film thickness of the aforementioned sidewall.

Fifth advantageous effect of the present invention is to improve the efficiency for generating BTBT holes. In the seventh and eighth embodiments, the oxide films having smaller thickness than the ONO films is formed after removing the ONO films on the diffusion layer, thereby effectively inducing the tunneling phenomenon at lower voltage.

What is claimed is:

1. A nonvolatile semiconductor memory device, comprising:

a semiconductor substrate having thereon a plurality of diffusion layers for forming bit lines and a plurality of channel regions disposed between said adjacent diffusion layers;

an insulating film formed on said semiconductor substrate for trapping electric charge;

an electrical conductive film formed on said insulating film for forming a word line; and an oxide film formed on said insulating film on said diffusion layers, wherein said insulating film is generally flatly formed on both said diffusion layers and said channel regions, and wherein said electrical conductive film comprises at least a first electrical conductive film formed on said insulating film on said channel regions and a second electrical conductive film covering said first electrical conductive film, said oxide film being formed by oxidizing said first electrical conductive film.

2. A nonvolatile semiconductor memory device, comprising:

a semiconductor substrate having thereon a plurality of diffusion layers for forming bit lines and a plurality of channel regions disposed between said adjacent diffusion layers;

an oxide film on said diffusion layers;

an insulating film formed on said semiconductor substrate for trapping electric charge; and an electrical conductive film formed on said insulating film for forming a word line, wherein said insulating film is generally flatly formed on said channel region, and wherein said electrical conductive film comprises at least a first electrical conductive film formed on said insulating film on said channel region and a second electrical conductive film covering said first electrical conductive film, said oxide film being formed by oxidizing said first electrical conductive film and said insulating film.

3. The nonvolatile semiconductor memory device according to claim 2, wherein said insulating film is formed such that the thickness of said insulating film is smaller on said diffusion layers than the thickness thereof on said channel regions.

4. The nonvolatile semiconductor memory device according to claim 1, wherein said first electrical conductive film includes polycrystalline silicon, amorphous silicon, or a silicon compound, and wherein said second electrical conductive film includes polysilicon or refractory metal silicide.

5. The nonvolatile semiconductor memory device according to claim 2, wherein said first electrical conductive film includes polycrystalline silicon, amorphous silicon, or a silicon compound, and wherein said second electrical conductive film includes polysilicon or refractory metal silicide.

6. The nonvolatile semiconductor memory device according to claim 1, wherein said insulating film comprises ON films, said ON films being formed by depositing a silicon oxide film and subsequently depositing a silicon nitride film thereon, or ONO films, said ONO films being formed by depositing a silicon oxide film, subsequently depositing a silicon nitride film thereon and subsequently depositing a silicon oxide film thereon.

7. The nonvolatile semiconductor memory device according to claim 2, wherein said insulating film comprises ON films, said ON films being formed by depositing a silicon oxide film and subsequently depositing a silicon nitride film thereon, or ONO films, said ONO films being formed by depositing a silicon oxide film, subsequently depositing a silicon nitride film thereon and subsequently depositing a silicon oxide film thereon.

8. The nonvolatile semiconductor memory device according to claim 6, wherein parts of said silicon nitride film of said ON films or said ONO films formed on said diffusion layers are transmuted by ion-implantation.

9. The nonvolatile semiconductor memory device according to claim 7, wherein parts of said silicon nitride film of said ON films or said ONO films formed on said diffusion layers are transmuted by ion-implantation.

* * * * *